United States Patent
Lee et al.

(10) Patent No.: US 11,163,638 B2
(45) Date of Patent: Nov. 2, 2021

(54) MEMORY DEVICE FOR SWAPPING DATA AND OPERATING METHOD THEREOF

(71) Applicant: SAMSUNG ELECTRONICS CO., LTD., Suwon-si (KR)

(72) Inventors: Jeongho Lee, Suwon-si (KR); Youngsik Kim, Suwon-si (KR); Seungyou Baek, Suwom-si (KR); Youngkwang Yoo, Suwon-si (KR); Younggeun Lee, Suwon-si (KR); Yena Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 16/695,395

(22) Filed: Nov. 26, 2019

(65) Prior Publication Data

US 2020/0319962 A1 Oct. 8, 2020

(30) Foreign Application Priority Data

Apr. 5, 2019 (KR) .................. 10-2019-0040123

(51) Int. Cl.
| | |
|---|---|
| *G11C 29/00* | (2006.01) |
| *G06F 11/10* | (2006.01) |
| *G06F 11/30* | (2006.01) |
| *G06F 9/54* | (2006.01) |
| *G11C 13/00* | (2006.01) |
| *G06F 12/02* | (2006.01) |
| *G06F 9/30* | (2018.01) |

(52) U.S. Cl.
CPC ...... *G06F 11/1044* (2013.01); *G06F 9/30029* (2013.01); *G06F 9/544* (2013.01); *G06F 11/3037* (2013.01); *G06F 12/0246* (2013.01); *G11C 13/0004* (2013.01); *G11C 13/004* (2013.01); *G11C 13/0069* (2013.01)

(58) Field of Classification Search
CPC .. G06F 11/1044; G06F 11/3039; G06F 9/544; G06F 9/30029; G06F 12/0246; G11C 13/0069; G11C 13/004; G11C 13/0004
See application file for complete search history.

(56) References Cited

U.S. PATENT DOCUMENTS

| | | |
|---|---|---|
| 7,797,481 B2 | 9/2010 | Lee et al. |
| 8,307,163 B2 | 11/2012 | Chen et al. |
| (Continued) | | |

FOREIGN PATENT DOCUMENTS

KR   1020090036396 A   4/2009

*Primary Examiner* — Samir W Rizk
(74) *Attorney, Agent, or Firm* — Volentine, Whitt & Francos, PLLC

(57) ABSTRACT

An operating method of a memory device, which includes a first memory region and a second memory region, includes reading first data from the first memory region and storing the read first data in a data buffer block, performing a first XOR operation on the first data provided from the data buffer block and second data read from the second memory region to generate first result data, writing the first data stored in the data buffer block in the second memory region, performing a second XOR operation on the first data and the first result data to generate the second data, storing the generated second data in the data buffer block, and writing the second data stored in the data buffer block in the first memory region.

20 Claims, 19 Drawing Sheets

(56) References Cited

U.S. PATENT DOCUMENTS

| | | | |
|---|---|---|---|
| 9,411,519 B2 | 8/2016 | Tressler et al. | |
| 9,648,465 B1 | 5/2017 | Murff | |
| 9,740,607 B2 | 8/2017 | Wheeler | |
| 2006/0050314 A1* | 3/2006 | Shiga | G11C 16/102 358/1.16 |
| 2007/0055905 A1* | 3/2007 | Chou | G11B 20/1833 714/6.12 |
| 2013/0332676 A1* | 12/2013 | Kotla | G06F 12/0895 711/129 |
| 2015/0095551 A1 | 4/2015 | Confalonieri et al. | |
| 2015/0149728 A1* | 5/2015 | Moon | G06F 12/123 711/133 |
| 2017/0344278 A1* | 11/2017 | Hong | G11C 16/349 |
| 2018/0197602 A1* | 7/2018 | Lim | G11C 13/0002 |

\* cited by examiner

MEMORY DEVICE FOR SWAPPING DATA AND OPERATING METHOD THEREOF

CROSS-REFERENCE TO RELATED APPLICATIONS

This application claims priority under 35 U.S.C. § 119 to Korean Patent Application No. 10-2019-0040123 filed on Apr. 5, 2019, in the Korean Intellectual Property Office, the disclosure of which is incorporated by reference herein in its entirety.

BACKGROUND

Embodiments of the disclosure described herein relate to a semiconductor device, and more particularly, relate to a memory device for swapping data stored in different memory regions and an operating method thereof.

Semiconductor memory devices are classified into a volatile memory device in which stored data disappear when power is turned off and a nonvolatile memory device in which stored data are retained even when power is turned off.

A memory device may swap data stored in different memory regions for the purpose of bad-block management, wear-leveling, etc. To swap data, data stored in the memory device may be transferred to a memory controller and the data transferred to the memory controller may be again transferred to the memory device. In this case, data communication between the memory device and the memory controller may cause an increase in overhead. Also, the memory controller may require a separate swap buffer for the data swap and the data communication between the memory device and the memory controller may cause a decrease in a swap speed.

SUMMARY

Embodiments of the disclosure provide a memory device capable of swapping data within the memory device without using a memory controller and an operating method thereof.

According to an exemplary embodiment, an operating method of a memory device, which includes a first memory region and a second memory region, includes reading first data from the first memory region and storing the read first data in a data buffer block, performing a first XOR operation on the first data provided from the data buffer block and second data read from the second memory region to generate first result data, writing the first data stored in the data buffer block in the second memory region, performing a second XOR operation on the first data and the first result data to generate the second data, storing the generated second data in the data buffer block, and writing the second data stored in the data buffer block in the first memory region.

According to an exemplary embodiment, a memory device includes a memory cell array that includes a first memory region storing first data and a second memory region storing second data, a read circuit that reads the first data from the first memory region, data generation logic that generates third data identical to the second data based on the second data from the second memory region, a selection circuit that outputs one of the first data from the read circuit and the third data from the data generation logic based on a control signal, a data buffer block that stores the first data or the third data output from the selection circuit, and a write circuit that writes the first data of the data buffer block in the second memory region and writes the third data of the data buffer block in the first memory region.

According to an exemplary embodiment, an operating method of a memory device, which includes a first memory region and a second memory region, includes reading first data from the first memory region and storing the read first data in a data buffer, reading second data from the second memory region and storing the read second data in a swap buffer, writing the first data stored in the data buffer in the second memory region, and writing the second data stored in the swap buffer in the first memory region.

According to an exemplary embodiment, a memory device may include a memory cell array that includes a first memory cell area and a second memory cell area, a data buffer block that stores first data from the first memory region, a data comparison write circuit that performs a first XOR operation on the first data from the data buffer block and the second data from the second memory region and outputs first result data, a write circuit that writes the first data from the data buffer block in the second memory region, a read circuit that reads the first data stored in the first memory region or the second memory region, an XOR gate that performs a second XOR operation on the first result data of the data comparison write circuit and the first data from the read circuit and generates the second data, and a selection circuit that outputs one of the second data from the XOR gate and an output of the read circuit. The second data from the selection circuit are stored in the data buffer block, and the write circuit writes the second data from the data buffer block in the first memory region.

According to an exemplary embodiment, an operating method of a memory device which includes a first memory region and a second memory region may include reading first data from the first memory region of a first bank, storing the read first data in a first data buffer corresponding to the first bank, reading second data from the second memory region of a second bank and storing the read second data in a second data buffer corresponding to the second bank, writing the second data stored in the second data buffer in the first memory region, and writing the first data stored in the first data buffer in the second memory region.

According to an exemplary embodiment, an operating method of a memory device having a memory cell array, a row decoder, a control circuit, a read circuit, a write circuit, a first buffer and a second buffer may be executable by the control circuit. The method includes operations of: 1) controlling the read circuit to read first data from a first location of the memory cell array identified by a first address; 2) controlling the first buffer to store the first data that is read in operation (1) or an error-corrected version of the first data; 3) controlling the write circuit to write the first data or the error-corrected version of the first data, which is stored in the first buffer, into a second location of the memory cell array identified by a second address; 4) controlling the second buffer to store second data written at the second location of the memory cell array or an error-corrected version of the second data; and 5) controlling the write circuit to write the second data or the error-corrected version of the second data, which is stored in the second buffer, into the first location of the memory cell array identified by the first address. Operations (1) through (5) are performed in response to the control circuit receiving one or more commands from a memory controller that is disposed externally to the memory device.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
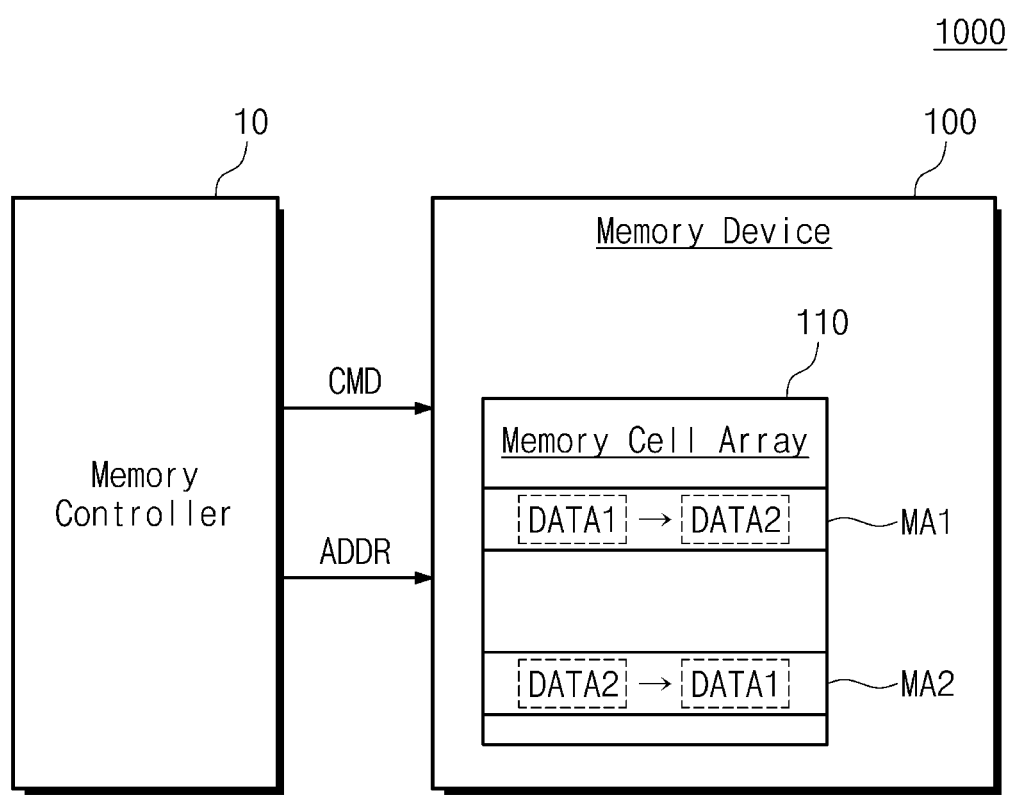
FIG. 1 illustrates a memory system according to an exemplary embodiment of the disclosure.

FIG. 1 illustrates a memory system according to an exemplary embodiment of the disclosure. Referring to FIG. 1, a memory system 1000 may include a memory controller 10 and a memory device 100.

The memory controller 10 may control an operation of the memory device 100. The memory controller 10 may provide a command CMD and an address ADDR for the purpose of controlling the memory device 100. The memory device 100 may operate in response to the command CMD and the address ADDR. For example, the memory device 100 may write data (e.g., write data) in a memory region corresponding to the address ADDR in response to a write command WC and the address ADDR. For example, the memory device 100 may read data (e.g., read data) from the memory region corresponding to the address ADDR in response to a read command RC and the address ADDR.

The memory device 100 includes a memory cell array 110. The memory cell array 110 may include one or more banks. Each of the banks may include memory regions for storing data. Each of the memory regions may include a plurality of memory cells.

For example, the memory cell array 110 may include a first memory region MA1 and a second memory region MA2. The first memory region MA1 and the second memory region MA2 may be included in one bank or different banks. The first memory region MA1 may store first data DATA1, and the second memory region MA2 may store second data DATA2.

The memory device 100 may include a phase-change memory random access memory (PRAM). However, the disclosure is not limited thereto. For example, the memory device 100 may include a volatile memory, such as a static RAM (SRAM), a dynamic RAM (DRAM), or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a magnetic RAM (MRAM), a resistive RAM (RRAM), or a ferroelectric RAM (FRAM).

According to an exemplary embodiment of the disclosure, the memory controller 10 may provide the command CMD and the address ADDR to the memory device 100 for the purpose of swapping data stored in different memory regions of the memory device 100.

For example, for a data swap, the memory controller 10 may provide one swap command SWAP and two addresses ADDR1 and ADDR2. The first address ADDR1 may correspond to the first memory region MA1, and the second address ADDR2 may correspond to the second memory region MA2. In this case, the memory device 100 may swap the first data DATA1 stored in the first memory region MA1 with the second data DATA2 stored in the second memory region MA2 in response to the swap command SWAP. As such, the second data DATA2 may be stored in the first memory region MA1, and the first data DATA1 may be stored in the second memory region MA2.

Alternatively, for the data swap, the memory controller 10 may provide a plurality of commands CMD and a plurality of addresses ADDR. The plurality of commands CMD may include an active command ACT and the write command WC. That is, the memory controller 10 may swap the first data DATA1 stored in the first memory region MA1 with the second data DATA2 stored in the second memory region MA2 without using the separate swap command SWAP.

As described above, the memory device 100 may receive the command CMD and the address ADDR from the memory controller 10 and may swap data. That is, the memory device 100 may swap data therein without transferring data stored in the memory cell array 110 to the memory controller 10. Accordingly, a data swap speed may be improved, and the communication overhead between the memory device 100 and the memory controller 10 due to the data swap may decrease.

Figure 2:
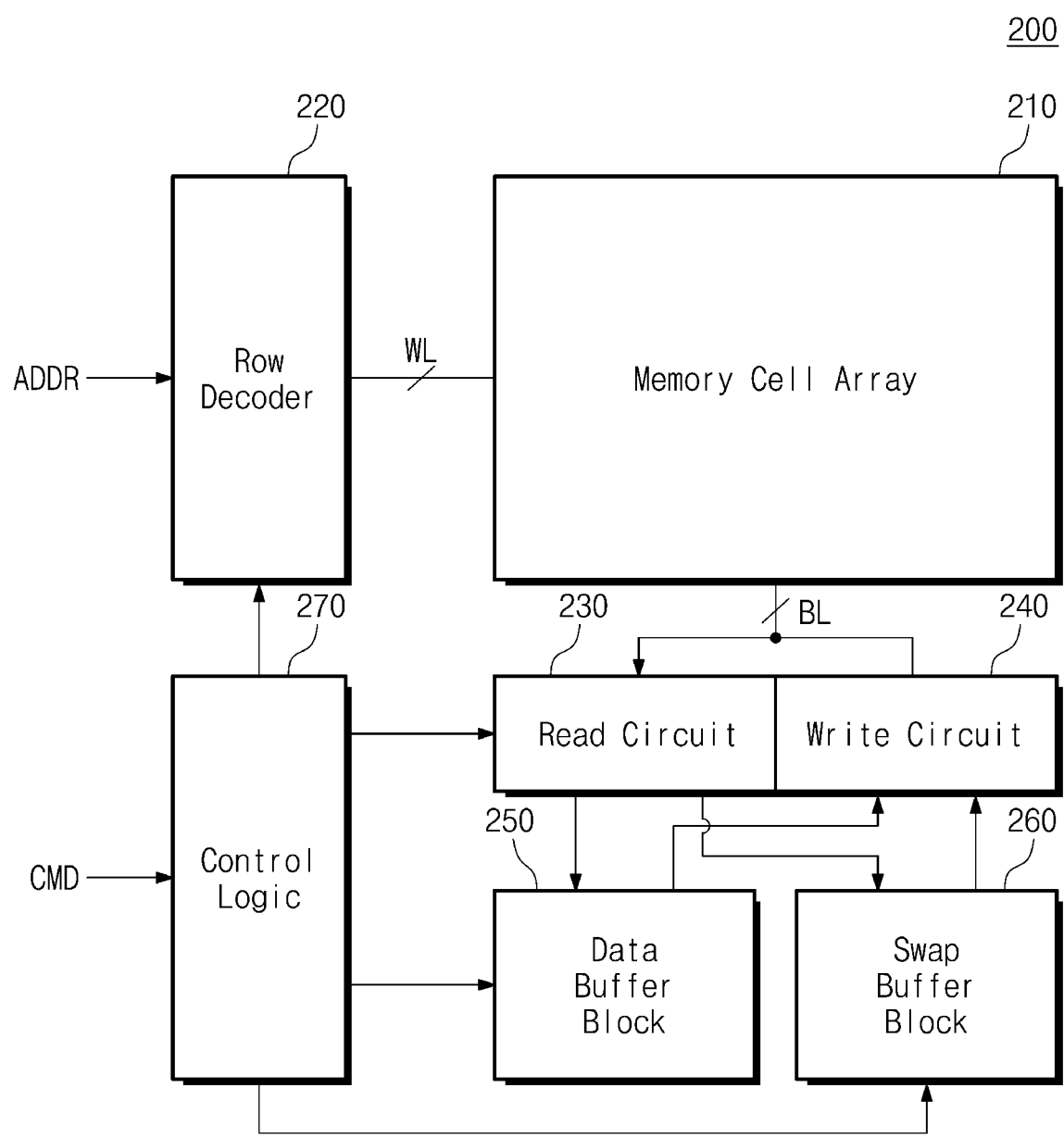
FIG. 2 illustrates an exemplary block diagram of a memory device of FIG. 1 for swapping data within the memory device.

FIG. 2 illustrates an exemplary block diagram of a memory device of FIG. 1 for swapping data within the memory device. Referring to FIG. 2, a memory device 200 may include a memory cell array 210, a row decoder 220, a read circuit 230, a write circuit 240, a data buffer block 250, a swap buffer block 260, and control logic 270.

The memory cell array 210 may include one or more banks, each of which includes memory regions for storing data. Each of the memory regions may include memory cells connected to word lines WL and bit lines BL. For example, memory cells in each row may be connected to one wordline WL. Memory cells in each column may be connected to one bit-line BL. However, the disclosure is not limited thereto. For example, memory cells in each column may be connected to one source line as well as one bit-line BL.

The row decoder 220 is connected to the memory cell array 210 through the word lines WL. The row decoder 220 may receive the address ADDR. In this case, the address ADDR may indicate a row address. The row decoder 220 may select one of the word lines WL based on the address ADDR. The row decoder 220 may apply a selection voltage or a selection current to the selected word line and may apply a non-selection voltage or a non-selection current to each of unselected word lines.

The read circuit 230 is connected to the memory cell array 210 through the bit lines BL. The read circuit 230 may apply voltages or currents to the bit lines BL such that data are read from the selected memory cells connected to the selected word line WL, and the write circuit 240 may apply voltages or currents to the bit lines BL such that data are written in the selected memory cells connected to the selected word line WL.

For example, in the case where the memory cell array 210 includes PRAM cells, the read circuit 230 may sense voltages or currents of the bit lines BL to read data from the selected memory cells. The write circuit 240 may perform a set operation or a reset operation on the selected memory cells to change resistance values of the selected memory cells. As such, data may be written in the selected memory cells. In an exemplary embodiment, the read circuit 230 may be a sense amplifier, and the write circuit 240 may be a write driver. However, the disclosure is not limited thereto. For example, the read circuit 230 may be implemented with various circuits capable of reading data from the memory cell array 210, and the write circuit 240 may be implemented with various circuits capable of writing data in the memory cell array 210.

The data buffer block 250 may store data read from the memory cell array 210 through the read circuit 230 and data provided from an external device (e.g., the memory controller 10 of FIG. 1). The data stored in the data buffer block 250 may be outputted to the external device or be written to the memory cell array 210 through the write circuit 240. For example, the data buffer block 250 may be a page buffer. However, the disclosure is not limited thereto.

The data buffer block 250 may include one or more data buffers. For example, the data buffer block 250 may include a data buffer corresponding to each of banks of the memory cell array 210. In this case, data transfer may be performed between the data buffer and the corresponding bank among the banks of the memory cell array 210.

The swap buffer block 260 may include one or more swap buffers. For example, the swap buffer block 260 may include a swap buffer corresponding to each of the banks of the memory cell array 210. In this case, the swap buffer may be used to swap data of the memory cell array 210.

The data transfer may be performed between the swap buffer block 260 and the memory cell array 210 through the read circuit 230 and the write circuit 240. In an exemplary embodiment, the swap buffer block 260 may store data read from a certain region of the memory cell array 210. In this case, the data stored in the swap buffer block 260 may be provided to a region of the memory cell array 210, which is different from the certain region.

That is, the data buffer block 250 may be used to provide data input from the external device to the memory cell array 210 or to output data read from the memory cell array 210 to the external device. In contrast, the swap buffer block 260 may be used to swap data stored in the memory cell array 210.

The control logic 270 may control an operation of each component of the memory device 200. For example, the control logic 270 may control operations of the row decoder 220, the read circuit 230, the write circuit 240, the data buffer block 250, and the swap buffer block 260. The control logic 270 may control an operation of each component based on the received command CMD. For example, when the command CMD for swap is provided, the control logic 270 may control the components to swap data of the memory cell array 210.

Below, an operation in which the memory device 200 swaps data will be described in detail with reference to FIGS. 3 to 5.

Figure 3:
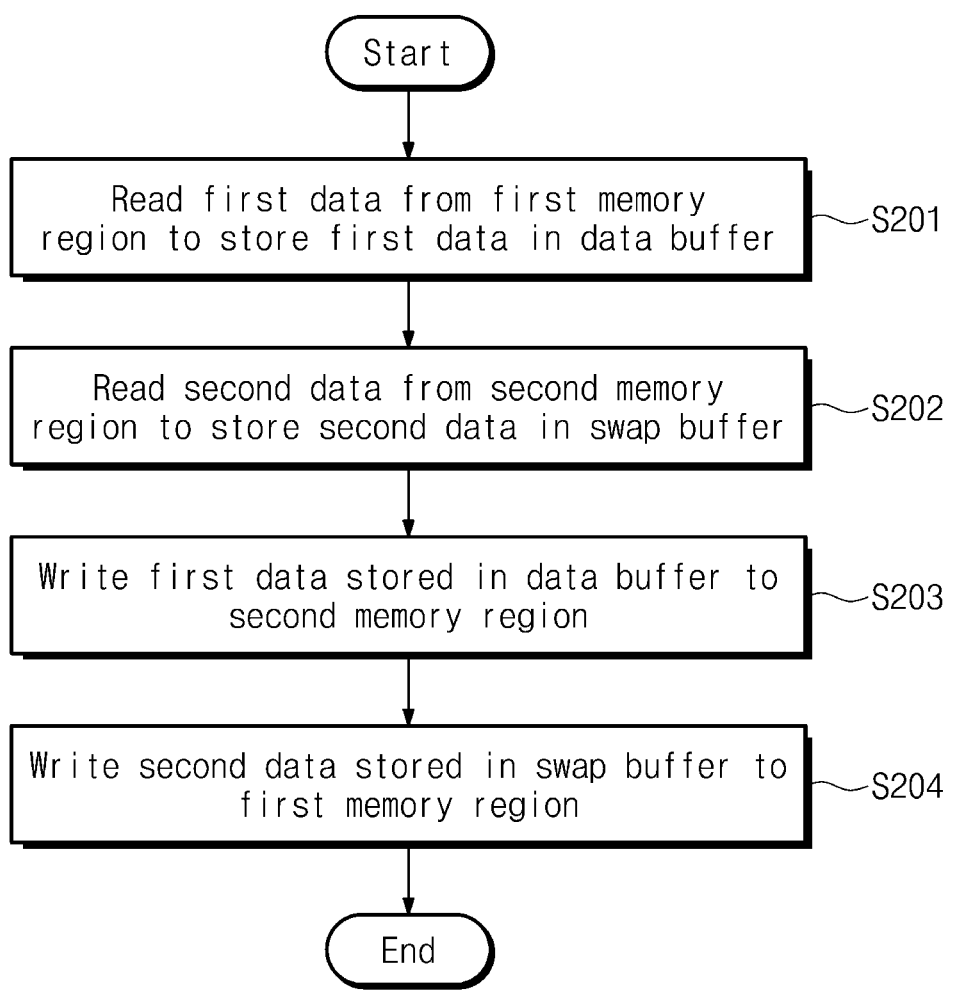
FIG. 3 is a flowchart illustrating an example of an operation of a memory device of FIG. 2.

FIG. 3 is a flowchart illustrating an example of an operation of a memory device of FIG. 2. In detail, FIG. 3 illustrates an example of an operation in which the memory device 200 swaps first data stored in a first memory region of the memory cell array 210 with second data stored in a second memory region thereof.

Referring to FIGS. 2 and 3, in operation S201, the memory device 200 may read the first data from the first memory region through the read circuit 230 and may store the first data in a data buffer. Here, the data buffer may be included in the data buffer block 250.

In operation S202, the memory device 200 may read the second data from the second memory region through the read circuit 230 and may store the second data in a swap buffer. Here, the swap buffer may be included in the swap buffer block 260.

In operation S203, the memory device 200 may write the first data stored in the data buffer in the second memory region through the write circuit 240. As such, the second data stored in the second memory region may be replaced with the first data.

In operation S204, the memory device 200 may write the second data stored in the swap buffer in the first memory region through the write circuit 240. As such, the first data stored in the first memory region may be replaced with the second data.

As described above, the memory device 200 may perform the operations of FIG. 3 in response to one swap command SWAP or a plurality of commands such as the active command ACT and the write command WC.

The description is given in FIG. 3 that operation S202 is performed after operation S201, but the disclosure is not limited thereto. For example, operation S202 may be performed before operation S201. Also, the description is given in FIG. 3 that operation S204 is performed after operation S203, but the disclosure is not limited thereto. For example, operation S204 may be performed before operation S203.

Figure 4:
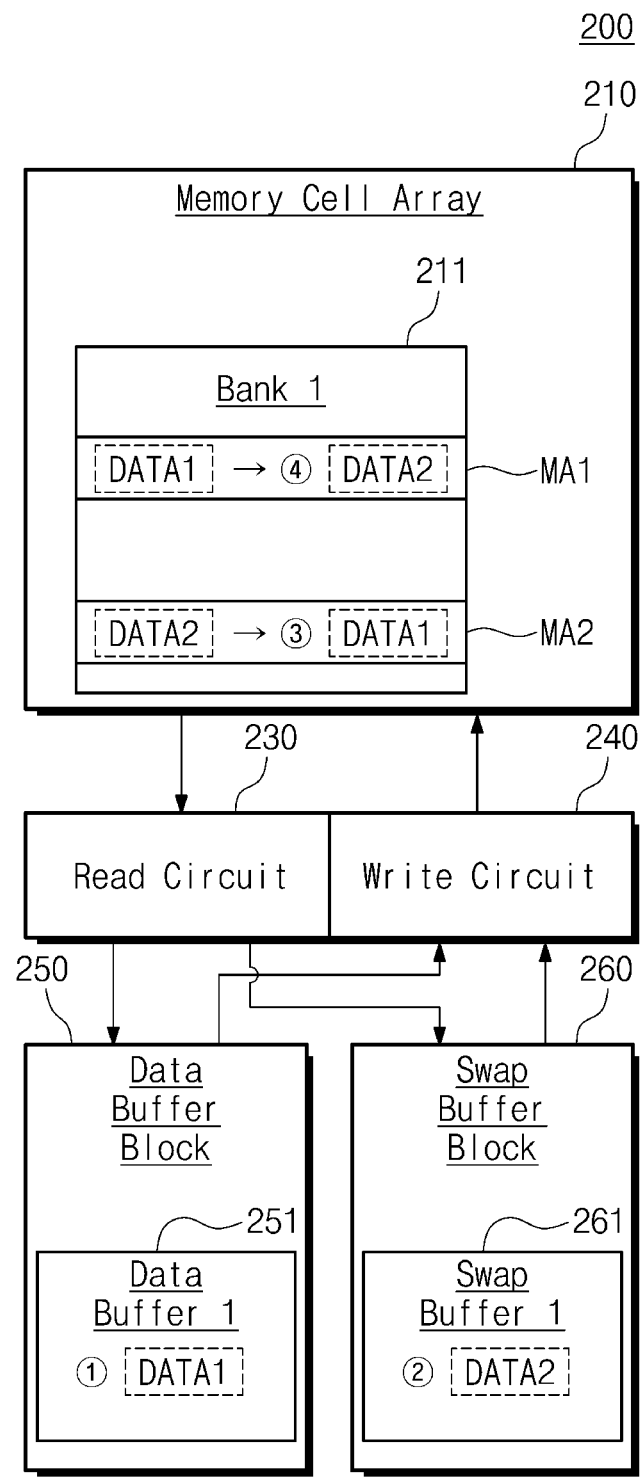
FIG. 4 illustrates an example of an operation in which a memory device of FIG. 2 swaps data stored in one bank.

FIG. 4 illustrates an example of an operation in which a memory device of FIG. 2 swaps data stored in one bank. Referring to FIG. 4, the memory cell array 210 may include a first bank 211. The first bank 211 may include the first memory region MA1 and the second memory region MA2. The first memory region MA1 may store the first data DATA1, and the second memory region MA2 may store the second data DATA2.

The data buffer block 250 may include a first data buffer 251. The first data buffer 251 may correspond to the first bank 211. The swap buffer block 260 may include a first swap buffer 261. The first swap buffer 261 may correspond to the first bank 211.

To swap the first data DATA1 stored in the first memory region MA1 with the second data DATA2 stored in the second memory region MA2, the first data DATA1 of the first memory region MA1 may be read through the read circuit 230. The first data DATA1 thus read may be stored in the first data buffer 251 (①). The second data DATA2 of the second memory region MA2 may be read through the read circuit 230. The second data DATA2 thus read may be stored in the first swap buffer 261 (②).

Afterwards, the first data DATA1 stored in the first data buffer 251 may be written in the second memory region MA2 through the write circuit 240 (③). As such, the second data DATA2 stored in the second memory region MA2 may be replaced with the first data DATA1. The second data DATA2 stored in the first swap buffer 261 may be written in the first memory region MA1 through the write circuit 240 (④). As such, the first data DATA1 stored in the first memory region MA1 may be replaced with the second data DATA2.

Figure 5:
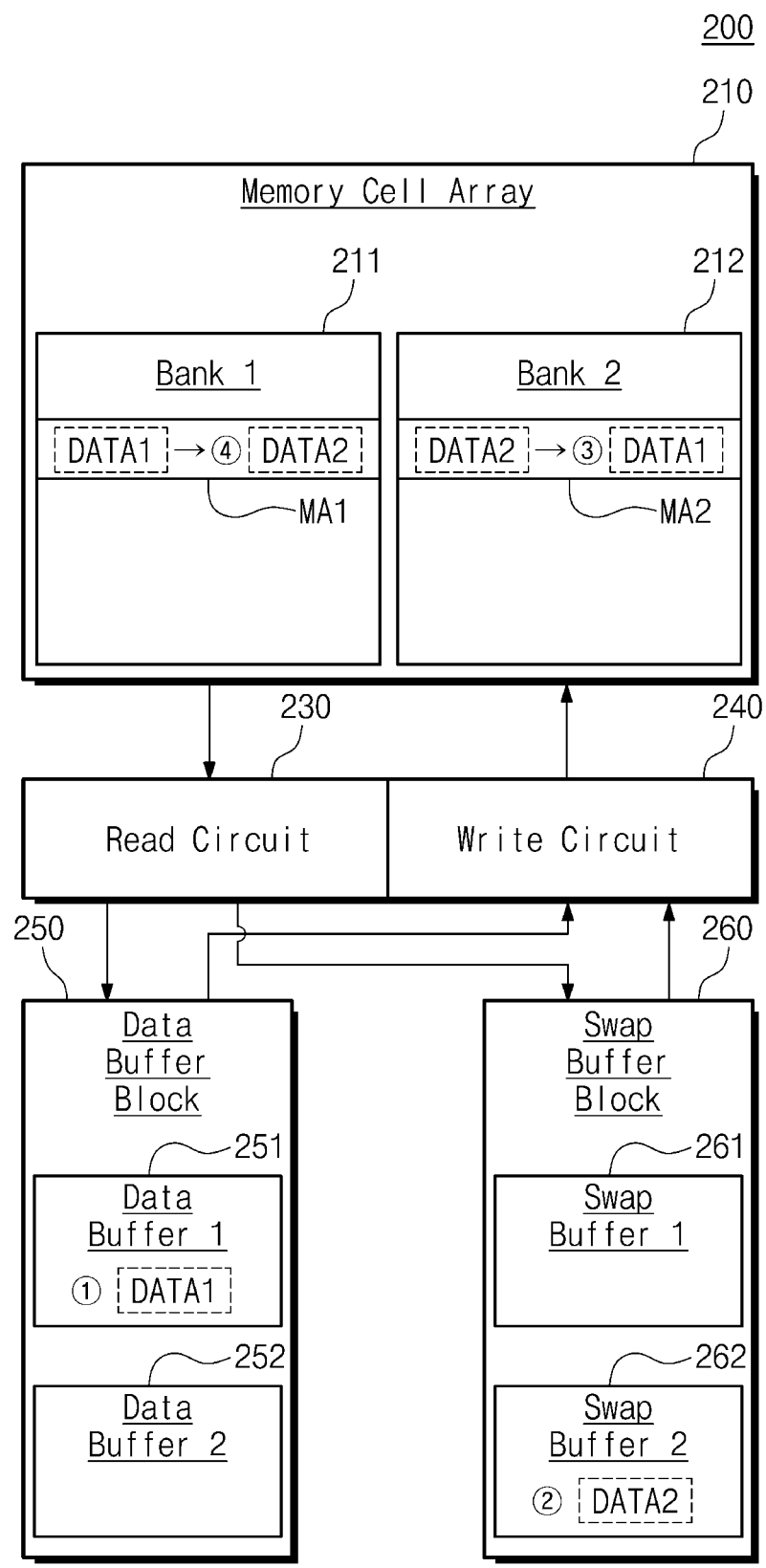
FIG. 5 illustrates an example of an operation in which a memory device of FIG. 2 swaps data stored in different banks.

FIG. 5 illustrates an example of an operation in which a memory device of FIG. 2 swaps data stored in different banks. Referring to FIG. 5, the memory cell array 210 may include the first bank 211 and a second bank 212. The first bank 211 may include the first memory region MA1. The second bank 212 may include the second memory region MA2. The first memory region MA1 may store the first data DATA1, and the second memory region MA2 may store the second data DATA2.

The data buffer block 250 may include the first data buffer 251 and a second data buffer 252. The first data buffer 251 may correspond to the first bank 211, and the second data buffer 252 may correspond to the second bank 212. The swap buffer block 260 may include the first swap buffer 261 and a second swap buffer 262. The first swap buffer 261 may correspond to the first bank 211, and the second swap buffer 262 may correspond to the second bank 212.

To swap the first data DATA1 stored in the first memory region MA1 with the second data DATA2 stored in the second memory region MA2, the first data DATA1 of the first memory region MA1 may be read through the read circuit 230. The first data DATA1 thus read may be stored in the data buffer block 250 (①). In this case, the first data DATA1 may be stored in the first data buffer 251 corresponding to the first bank 211. The second data DATA2 of the second memory region MA2 may be read through the read circuit 230. The second data DATA2 thus read may be stored in the swap buffer block 260 (②). In this case, the second data DATA2 may be stored in the second swap buffer 262 corresponding to the second bank 212.

Afterwards, the first data DATA1 stored in the first data buffer 251 may be written in the second memory region MA2 through the write circuit 240 (③). As such, the second data DATA2 stored in the second memory region MA2 may be replaced with the first data DATA1. In this case, the first data DATA1 stored in the first data buffer 251 may be transferred to the second data buffer 252, and the first data DATA1 may be provided to the write circuit 240 from the second data buffer 252.

The second data DATA2 stored in the second swap buffer 262 may be written in the first memory region MA1 through the write circuit 240 (④). As such, the first data DATA1 stored in the first memory region MA1 may be replaced with the second data DATA2. In this case, the second data DATA2 stored in the second swap buffer 262 may be transferred to the first swap buffer 261, and the second data DATA2 may be provided to the write circuit 240 from the first swap buffer 261.

As described above, the memory device 200 according to an exemplary embodiment of the disclosure may swap data stored in one bank or two banks by using a data buffer and a separate swap buffer. As such, the memory device 200 may swap data without using an external memory controller. Accordingly, a data swap may be quickly performed, and the communication overhead between the memory device 200 and the memory controller 10 may decrease.

Figure 6:
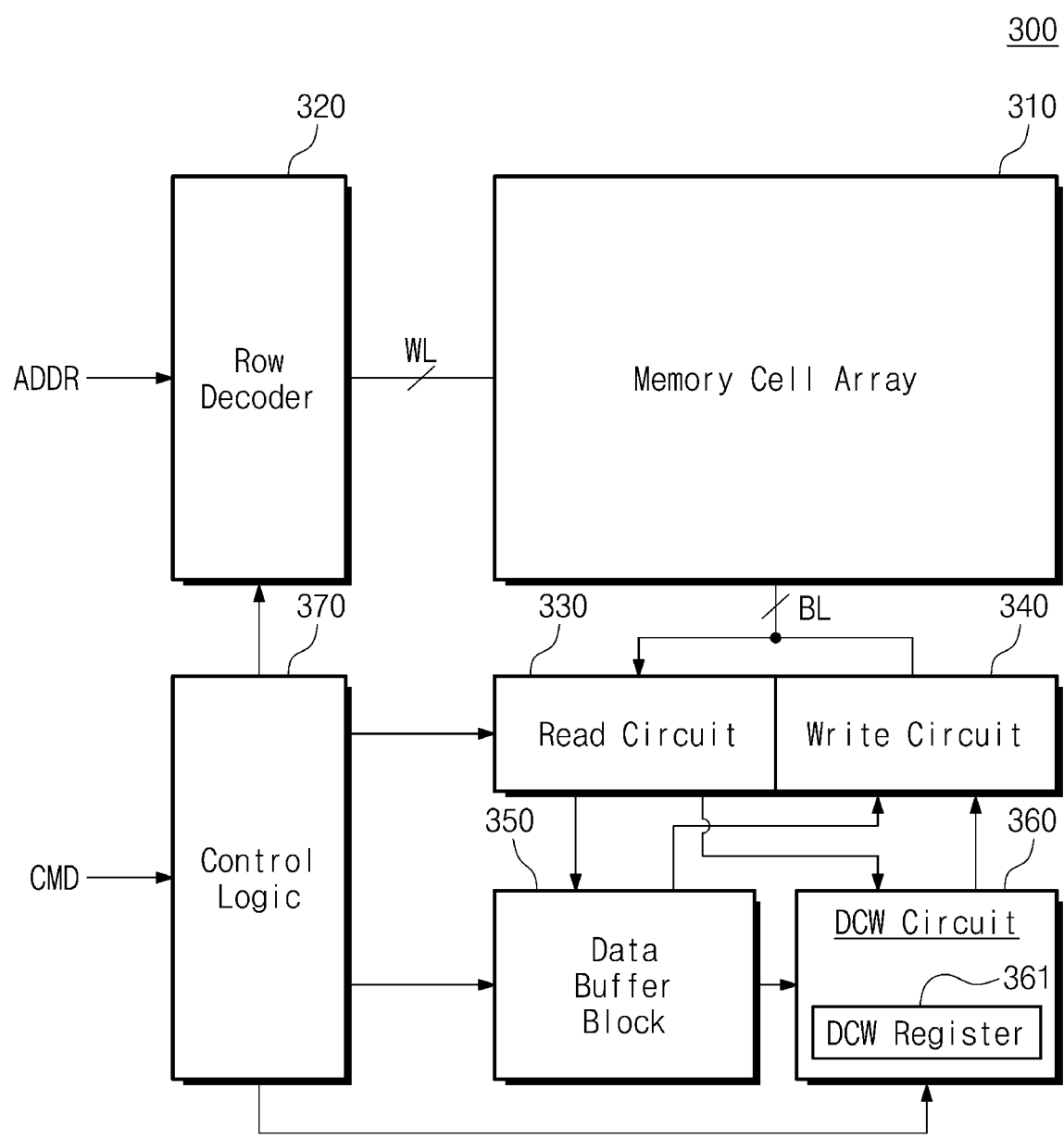
FIG. 6 illustrates another exemplary block diagram of a memory device of FIG. 1 for swapping data within the memory device.

FIG. 6 illustrates another exemplary block diagram of a memory device of FIG. 1 for swapping data within the memory device. Referring to FIG. 6, a memory device 300 may include a memory cell array 310, a row decoder 320, a read circuit 330, a write circuit 340, a data buffer block 350, a data comparison write (DCW) circuit 360, and control logic 370. Operations of the memory cell array 310, the row decoder 320, the read circuit 330, the write circuit 340, the data buffer block 350, and the control logic 370 are similar to the operations of the memory cell array 210, the row decoder 220, the read circuit 230, the write circuit 240, the data buffer block 250, and the control logic 270 of FIG. 2, and thus, additional description will be omitted to avoid redundancy.

The data comparison write circuit 360 may include a DCW register 361. The DCW register 361 may be a buffer circuit storing data. The data comparison write circuit 360 may be used for a data write operation or a data swap operation.

In response to the write command WC, the data comparison write circuit 360 may compare data transferred to the data buffer block 350 and data read from the memory cell array 310. In detail, the data comparison write circuit 360 may compare data in the unit of a bit through an exclusive OR (XOR) operation. For example, in a write operation, new write data and the address ADDR where the new write data are to be stored may be provided to the memory device 300. The new write data may be stored in the data buffer block 350. The data comparison write circuit 360 may compare the new write data of the data buffer block 350 with data of a memory region, which corresponds to the address ADDR, of the memory cell array 310. When a comparison result indicates that the two data are the same, the data of the memory region may be maintained. When the comparison result indicates that the two data are different, the data of the memory region may be replaced with the new write data. In this case, at least one of the new write data of the data buffer block 350, the data read from the memory region, and the comparison result (e.g., data obtained by performing the XOR operation on the new write data and the data read from the memory region) may be stored in the DCW register 361. That is, when the comparison result indicates that the two data are different, the new write data may be written in the memory region of the memory cell array 310 through the write circuit 340. Accordingly, the memory device 300 may perform the write operation with low power through the data comparison write circuit 360.

When the swap command SWAP is provided to swap the first data and the second data stored in the memory cell array 310, the first data may be stored in the data buffer block 350 through the read circuit 330 and the second data may be stored in the DCW register 361 of the data comparison write circuit 360 through the read circuit 330. The write circuit 340 may replace the second data of the memory cell array 310 with the first data stored in the data buffer block 350 and may replace the first data of the memory cell array 310 with the second data stored in the DCW register 361. As such, data stored in different memory regions may be swapped.

That is, in the swap operation, the operation of the DCW register 361 may be similar to the operation of the swap buffer block 260 of FIG. 2.

As described above, the memory device 300 may swap data by using the DCW register 361 of the data comparison write circuit 360 without the separate swap buffer block 260 of FIG. 2. In this case, the DCW register 361 may be used as a buffer circuit that stores data to be swapped in the swap operation or may be used as a buffer circuit that stores at least one of new write data, data read from a memory region where the new write data are to be written, and XOR data being a comparison result of the new write data and the read data in the write operation.

The description is given in FIG. 6 that the DCW register 361 is included in the data comparison write circuit 360 and data of the memory cell array 310 are stored in the DCW register 361, but the disclosure is not limited thereto. For example, for the data swap, data of the memory cell array 310 may be stored in any circuit that is present within the data comparison write circuit 360 and provides a buffering function.

As described above, the memory device 300 may swap data by using the existing data comparison write circuit 360 that is provided for an efficient write operation. In this case, because a separate swap buffer is not required, the area of the memory device 300 may not increase.

Figure 7:
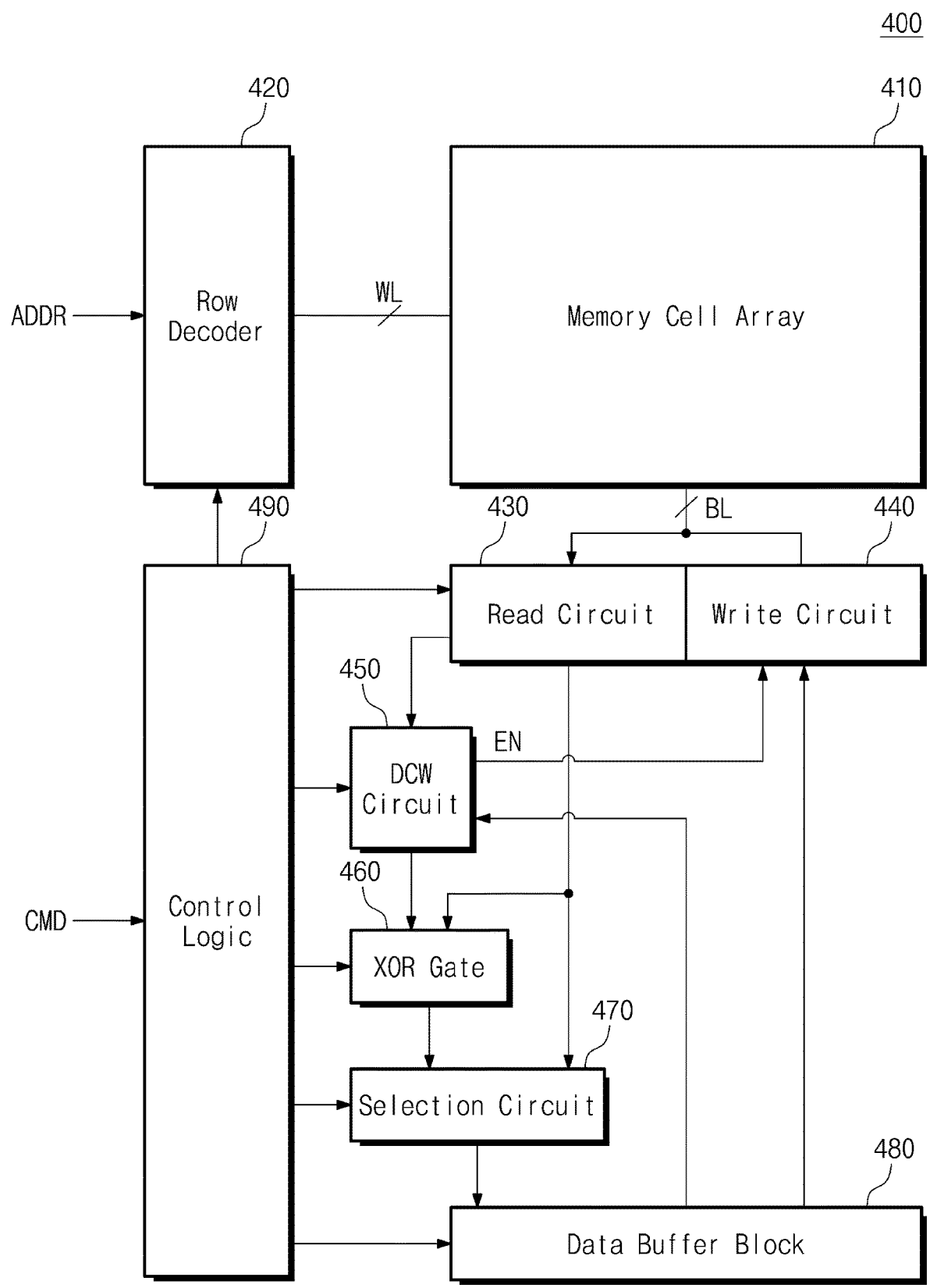
FIG. 7 illustrates another exemplary block diagram of a memory device of FIG. 1 for swapping data within the memory device.

FIG. 7 illustrates another exemplary block diagram of a memory device of FIG. 1 for swapping data within the memory device. Referring to FIG. 7, a memory device 400 may include a memory cell array 410, a row decoder 420, a read circuit 430, a write circuit 440, a data comparison write circuit 450, an XOR gate 460, a selection circuit 470, a data buffer block 480, and control logic 490. Operations of the memory cell array 410, the row decoder 420, the read circuit 430, the write circuit 440, the data buffer block 480, and the control logic 490 are similar to the operations of the memory cell array 210, the row decoder 220, the read circuit 230, the write circuit 240, the data buffer block 250, and the control logic 270 of FIG. 2, and thus, additional description will be omitted to avoid redundancy.

The data comparison write circuit 450 may receive data read from the memory cell array 410 through the read circuit 430. The data comparison write circuit 450 may receive data from the data buffer block 480. The data comparison write circuit 450 may compare data stored in the memory cell array 410 and data stored in the data buffer block 480. In detail, the data comparison write circuit 450 may compare data in the unit of a bit. For example, the data comparison write circuit 450 may perform the XOR operation to compare data. The data comparison write circuit 450 may provide an enable signal EN to the write circuit 440 based on a comparison result. For example, the data comparison write circuit 450 may perform the XOR operation and may output a result of the XOR operation as the enable signal EN.

The result of the XOR operation may be stored in the data comparison write circuit 450. For example, the result of the XOR operation may be stored in a separate register such as the DCW register 361 of FIG. 6, but the disclosure is not limited thereto.

The write circuit 440 may perform the write operation based on the enable signal EN. When the data stored in the memory cell array 410 and the data stored in the data buffer block 480 are the same, the write circuit 440 may not operate based on the enable signal EN. In this case, the data of the memory cell array 410 may be maintained. When the data stored in the memory cell array 410 and the data stored in the data buffer block 480 are different, the write circuit 440 may operate based on the enable signal EN. In this case, the data of the memory cell array 410 may be replaced with the data of the data buffer block 480. As such, the data of the data buffer block 480 may be written in the memory cell array 410 with low power based on the comparison result of the data comparison write circuit 450. However, the disclosure is not limited thereto. For example, the write circuit 440 may operate regardless of the comparison result of the data comparison write circuit 450 such that the data of the data buffer block 480 are written in the memory cell array 410.

The XOR gate 460 may perform an XOR operation on data output from the data comparison write circuit 450 and data output from the read circuit 430. A result of the XOR operation output from the XOR gate 460 may be provided to the selection circuit 470.

The selection circuit 470 may output one of data output from the XOR gate 460 and the data output from the read circuit 430 to the data buffer block 480. The selection circuit 470 may select data to be output to the data buffer block 480 based on a control signal from the control logic 490.

The data buffer block 480 may store data output from the selection circuit 470. Also, the data buffer block 480 may store data provided from an external device. The data stored in the data buffer block 480 may be written in the memory cell array 410 through the write circuit 440. In this case, the data stored in the data buffer block 480 may be written in the memory cell array 410 based on the enable signal EN.

The control logic 490 may control operations of the components of the memory device 400. In detail, the control logic 490 may control the row decoder 420, the read circuit 430, the write circuit 440, the data comparison write circuit 450, the XOR gate 460, the selection circuit 470, and the data buffer block 480. For example, when the command CMD for data swap is provided, the control logic 490 may control the components to swap data.

An example is illustrated in FIG. 7 that the XOR gate 460 receives the data output from the data comparison write circuit 450 and the data output from the read circuit 430, but the disclosure is not limited thereto. For example, the XOR gate 460 may receive the data stored in the data buffer block 480 instead of the data output from the read circuit 430. The XOR gate 460 may perform an XOR operation on the data output from the data comparison write circuit 450 and the data output from the data buffer block 480.

Below, an operation in which the memory device 400 swaps data will be described in detail with reference to FIGS. 8 to 12.

Figure 8:
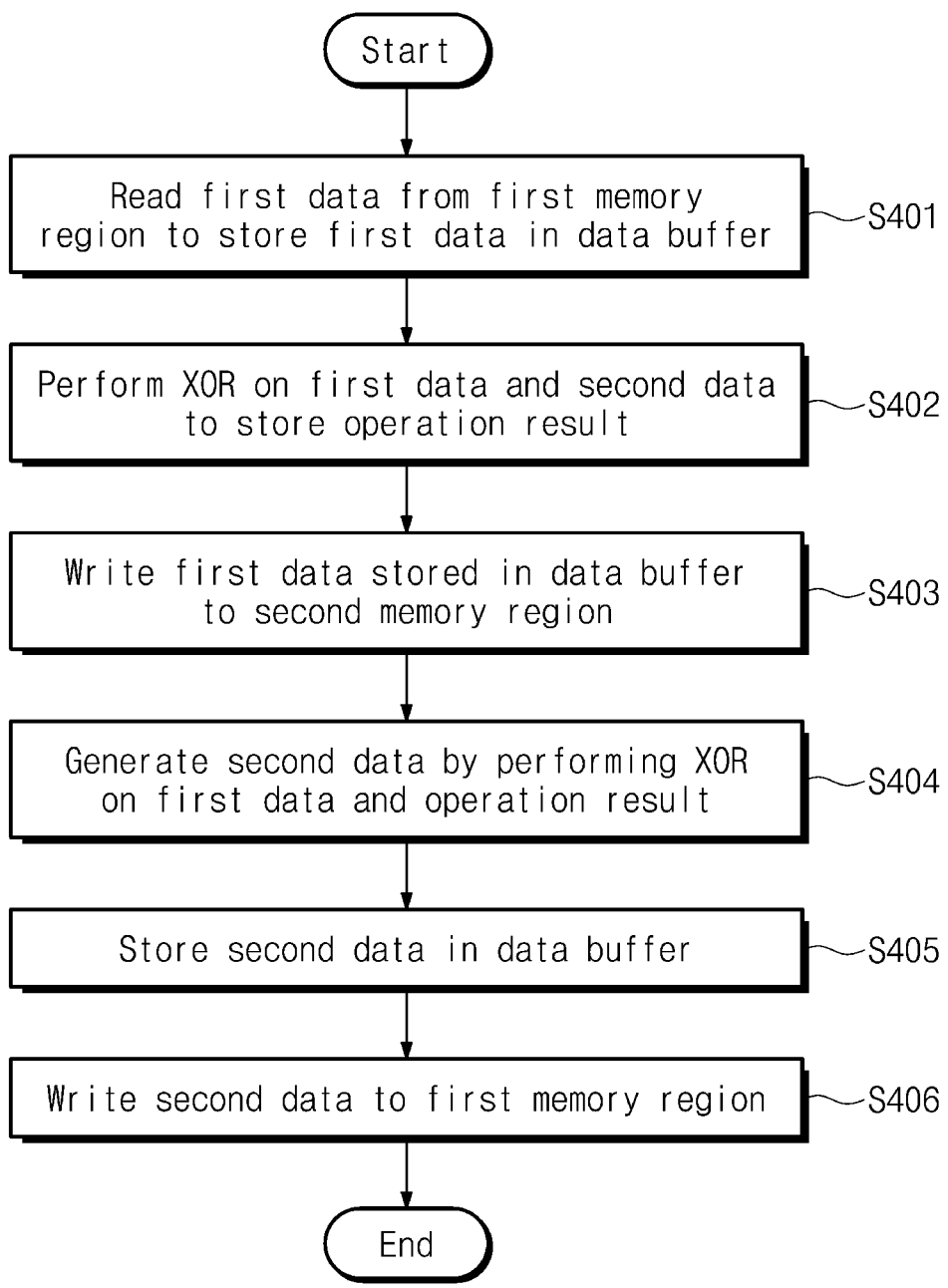
FIG. 8 is a flowchart illustrating an example of an operation of a memory device of FIG. 7.

FIG. 8 is a flowchart illustrating an example of an operation of a memory device of FIG. 7. In detail, FIG. 8 illustrates an example of an operation in which the memory device 400 swaps first data stored in a first memory region of the memory cell array 410 with second data stored in a second memory region thereof.

Referring to FIGS. 7 and 8, in operation S401, the memory device 400 may read the first data from the first memory region and may store the first data in a data buffer. The data buffer may be included in the data buffer block 480. In this case, the control logic 490 may control the selection circuit 470 such that data output from the read circuit 430 are selected. As such, the first data may be selected by the selection circuit 470 and may then be stored in the data buffer block 480.

In operation S402, the memory device 400 may perform an XOR operation on the first data provided from the data buffer and the second data read from the second memory region and may store a result of the XOR operation. The memory device 400 may perform an XOR operation through the data comparison write circuit 450 and may store a result of the XOR operation.

In operation S403, the memory device 400 may write the first data stored in the data buffer in the second memory region. For example, the write circuit 440 may write the first data based on the result (i.e., the enable signal EN) of the XOR operation output from the data comparison write circuit 450.

In operation S404, the memory device 400 may perform an XOR operation on the first data and the result of the XOR operation through the XOR gate 460 and may generate the second data. Here, the first data may be read from the first memory region or the second memory region through the read circuit 430. Alternatively, the first data may be read from the data buffer of the data buffer block 480. A result of the XOR operation that is performed on the result of the XOR operation output from the data comparison write circuit 450 and the first data may be identical to the second data. As such, the second data may be generated through the XOR gate 460.

In operation S405, the memory device 400 may store the generated second data in the data buffer. In this case, the control logic 490 may control the selection circuit 470 such that data output from the XOR gate 460 are selected. The selection circuit 470 may output the data output from the XOR gate 460 to the data buffer block 480. As such, the second data may be stored in the data buffer.

In operation S406, the memory device 400 may write the second data stored in the data buffer in the first memory region. For example, when the second data are written, the data comparison write circuit 450 may compare the first data stored in the first memory region and the second data stored in the data buffer. The write circuit 440 may write the second data based on a comparison result (i.e., the enable signal EN).

Figure 9:
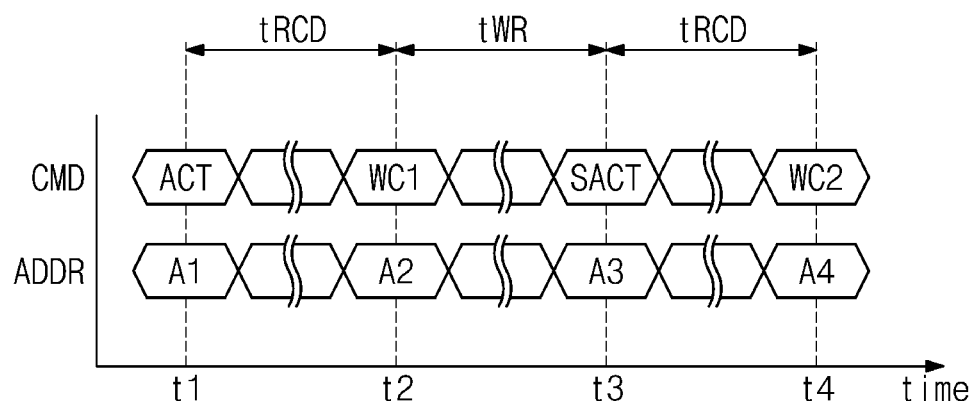
FIG. 9 illustrates an example of a command and an address provided to a memory device of FIG. 7 for a data swap.

FIG. 9 illustrates an example of a command and an address provided to a memory device of FIG. 7 for a data swap. FIGS. 10A to 10D illustrate an example of an operation in which a memory device of FIG. 7 swaps data based on a command and an address of FIG. 9. Below, an operation in which a memory device of FIG. 7 swaps data stored in one bank will be described with reference to FIGS. 9 to 10D. The command CMD and the address ADDR of FIG. 9 may be provided from a memory controller for the purpose of swapping the first data DATA1 and the second data DATA2 stored in a first bank 411.

Figure 10A:
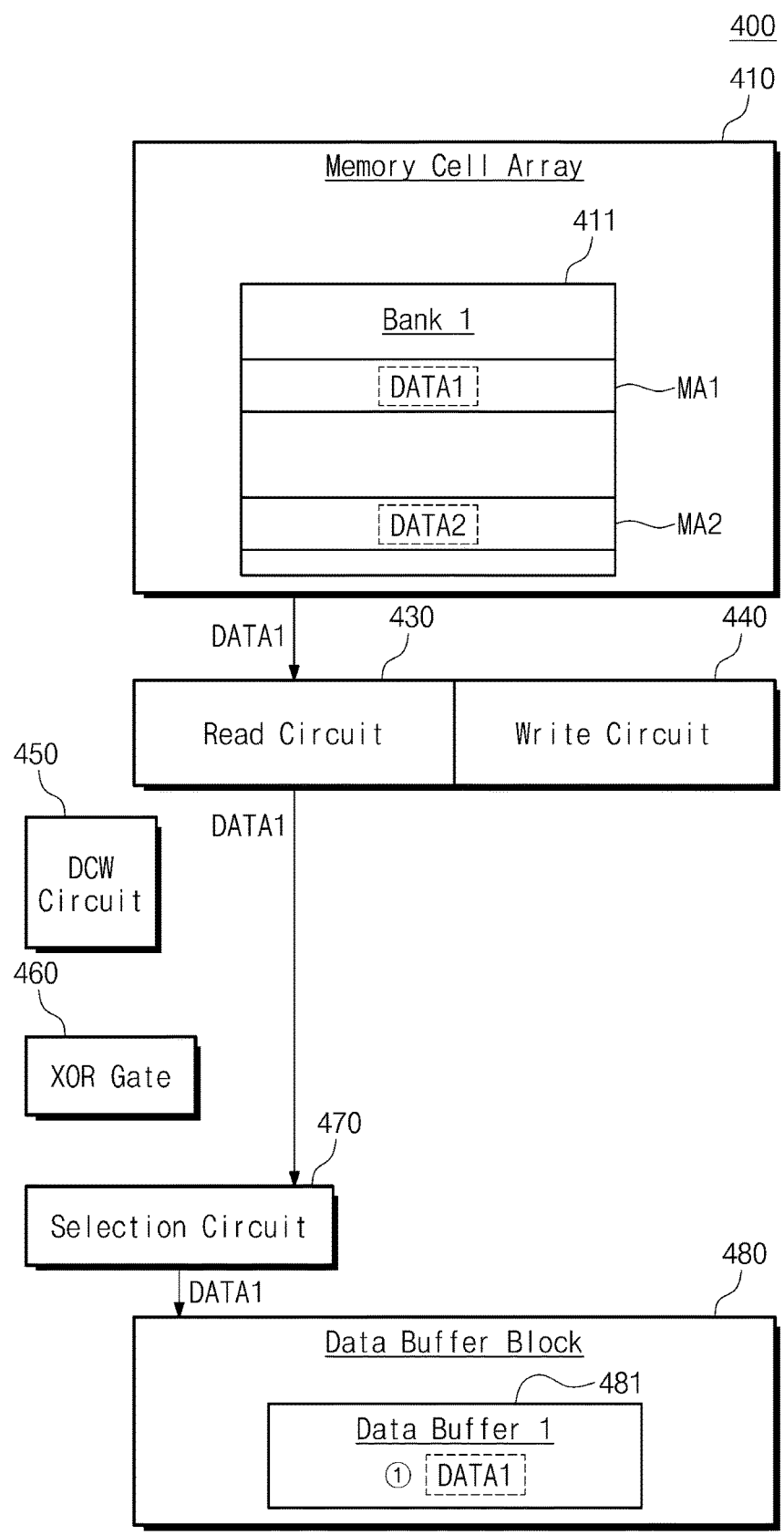
FIGS. 10A to 10D illustrate an example of an operation in which a memory device of FIG. 7 swaps data based on a command and an address of FIG. 9.

Referring to FIGS. 9 and 10A, at a first time t1, the active command ACT and an address A1 may be provided. The address A1 may indicate the first memory region MA1 of the first bank 411. In response to the active command ACT and the address A1, the read circuit 430 may read the first data DATA1 from the first memory region MA1. The first data DATA1 thus read may be output to the selection circuit 470. The selection circuit 470 may select the first data DATA1 output from the read circuit 430 and may store the first data DATA1 in a first data buffer 481 (①). The first data buffer 481 may correspond to the first bank 411.

Figure 10B:
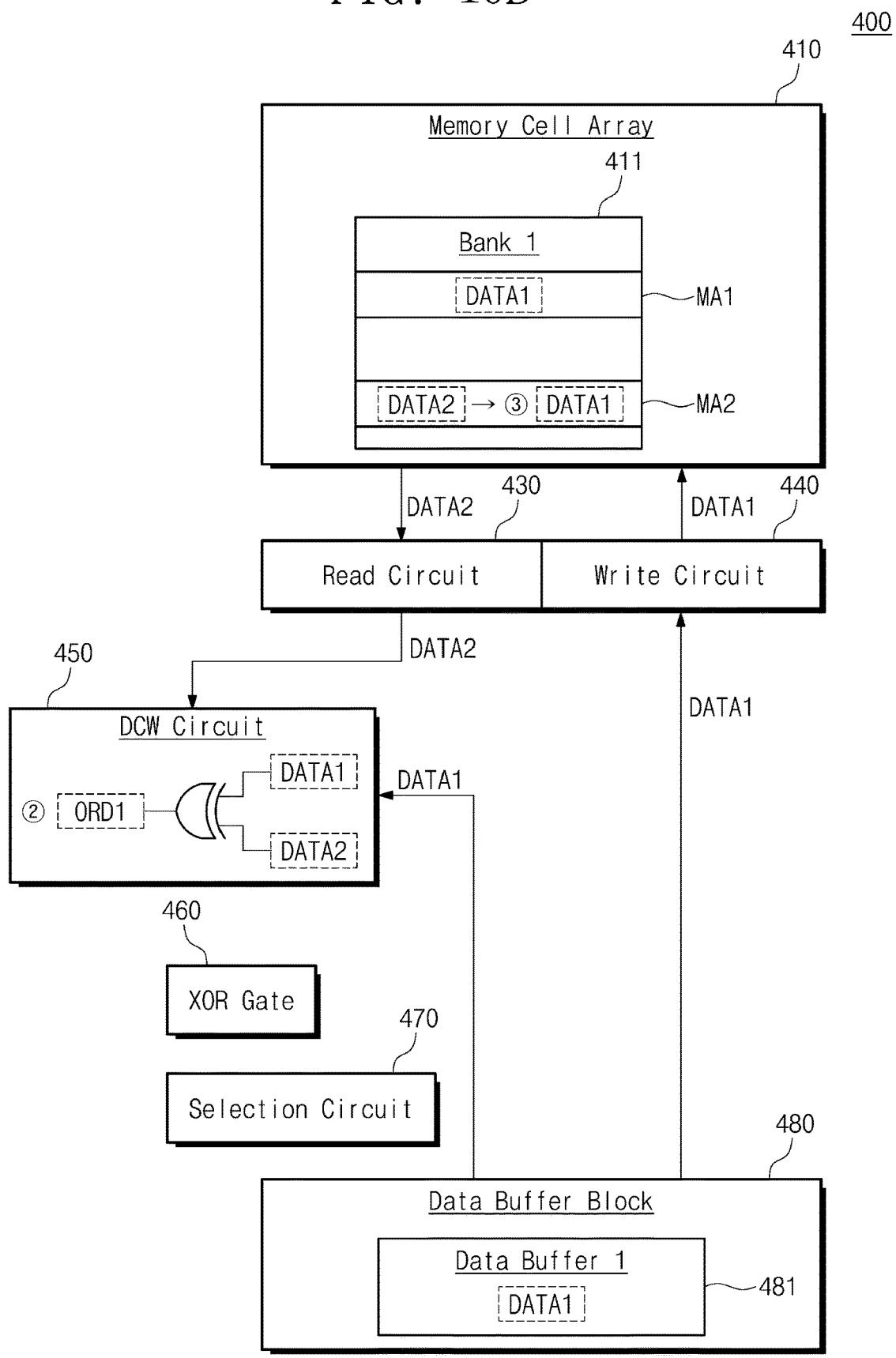

Referring to FIGS. 9 and 10B, after the active command ACT is provided and a delay time tRCD elapses, that is, at a second time t2, a write command WC1 and an address A2 may be provided. The address A2 may indicate the second memory region MA2 of the first bank 411. In response to the write command WC1 and the address A2, the read circuit 430 may read the second data DATA2 stored in the second memory region MA2 and may provide the second data DATA2 to the data comparison write circuit 450. The first data DATA1 stored in the first data buffer 481 may be provided to the data comparison write circuit 450. The data comparison write circuit 450 may perform an XOR operation on the first data DATA1 provided from the first data buffer 481 and the second data DATA2 read from the second memory region MA2 and may store a first operation result ORD1 as a result of the XOR operation (②). The write circuit 440 may write the first data DATA1 stored in the first data buffer 481 in the second memory region MA2 (③). For example, the write circuit 440 may write the first data DATA1 in the second memory region MA2 based on the first operation result ORD1.

Figure 10C:
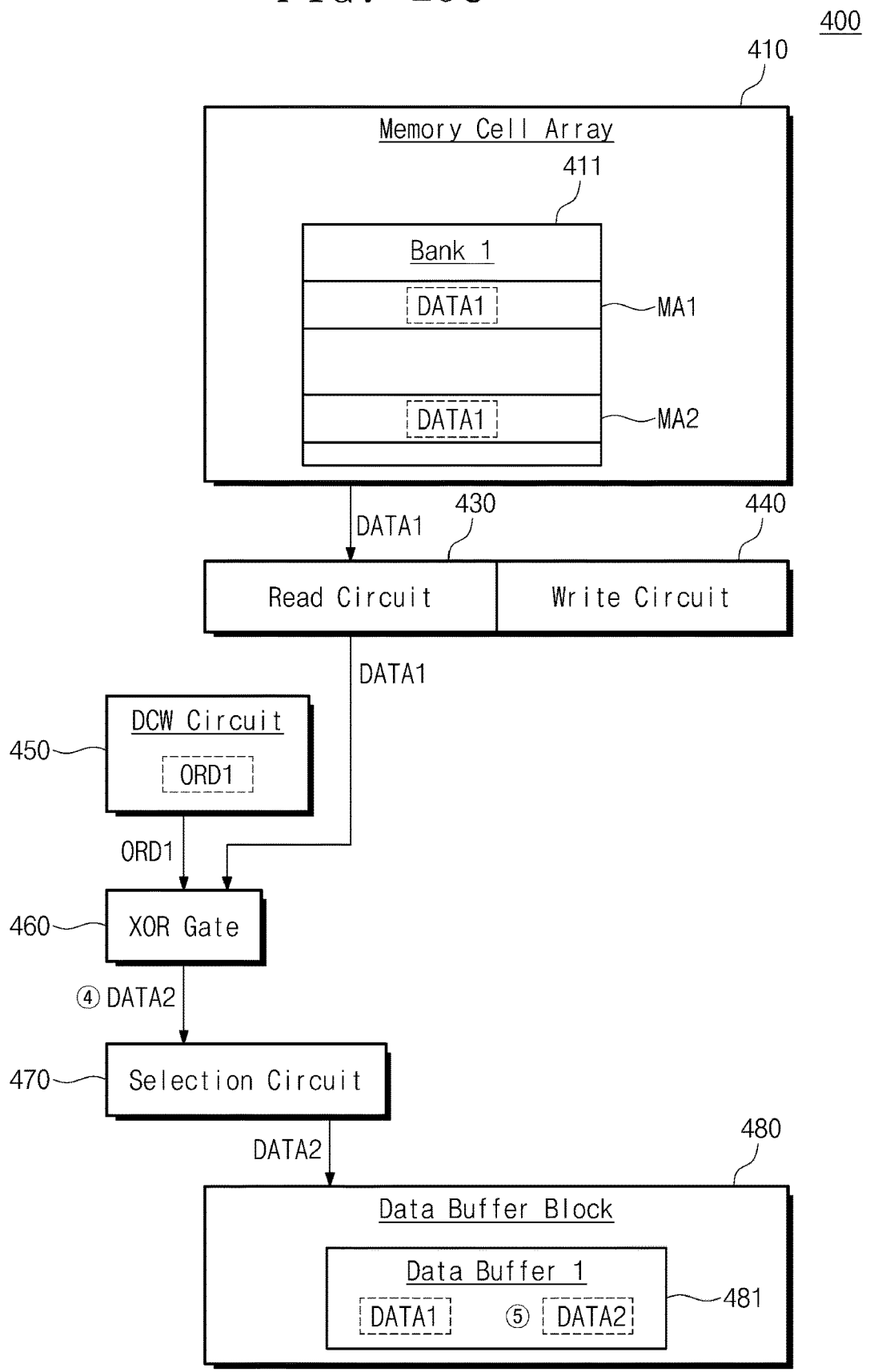

Referring to FIGS. 9 and 10C, after the write command WC1 is provided and a data recovery time tWR elapses, that is, at a third time t3, a swap active command SACT and an address A3 may be provided. The address A3 may indicate the second memory region MA2 of the first bank 411. In response to the swap active command SACT and the address A3, the read circuit 430 may read the first data DATA1 stored in the second memory region MA2 and may provide the first data DATA1 to the XOR gate 460. The XOR gate 460 may perform an XOR operation on the first operation result ORD1 and the first data DATA1 to generate the second data DATA2 (④). The selection circuit 470 may output the second data DATA2 output from the XOR gate 460 to the data buffer block 480. As such, the second data DATA2 may be stored in the first data buffer 481 (⑤).

Here, the swap active command SACT may be a command different from the active command ACT. The control logic 490 of FIG. 7 may control the selection circuit 470 in response to the active command ACT such that data output from the read circuit 430 are stored in the data buffer block 480. In contrast, the control logic 490 may control the selection circuit 470 in response to the swap active command SACT such that data output from the XOR gate 460 are stored in the data buffer block 480. For example, the active command ACT and the swap active command SACT may be identified based on a separate flag bit.

Figure 10D:
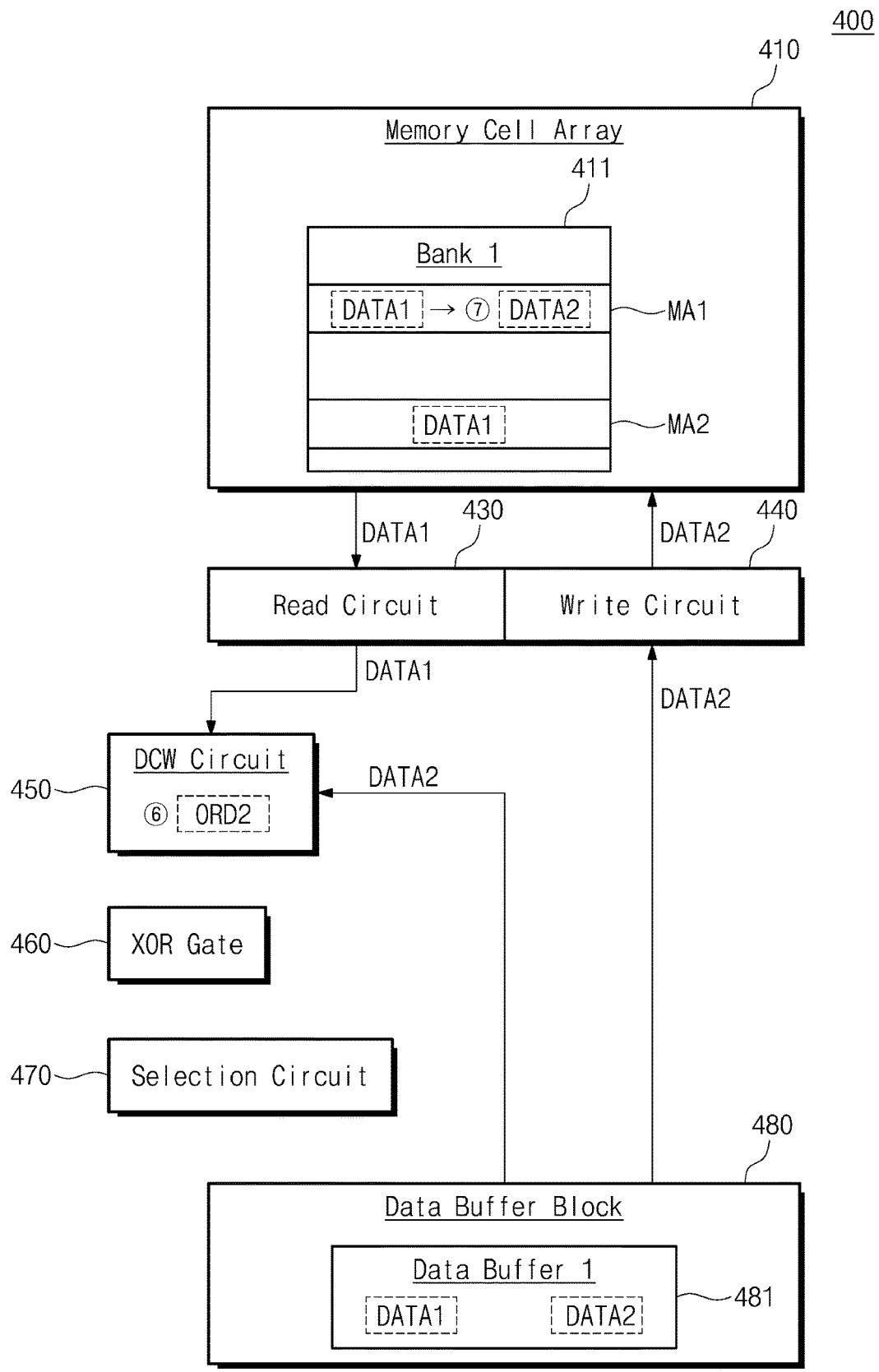

Referring to FIGS. 9 and 10D, after the swap active command SACT is provided and the delay time tRCD elapses, that is, at a fourth time t4, a write command WC2 and an address A4 may be provided. The address A4 may indicate the first memory region MA1 of the first bank 411. In response to the write command WC2 and the address A4, the read circuit 430 may read the first data DATA1 stored in the first memory region MA1 and may provide the first data DATA1 to the data comparison write circuit 450. The second data DATA2 stored in the first data buffer 481 may be provided to the data comparison write circuit 450. The data comparison write circuit 450 may perform an XOR operation on the first data DATA1 read from the first memory region MA1 and the second data DATA2 provided from the first data buffer 481 and may store a second operation result ORD2 as a result of the XOR operation (⑥). The write circuit 440 may write the second data DATA2 stored in the first data buffer 481 in the first memory region MA1 (⑦). For example, the write circuit 440 may write the second data DATA2 in the first memory region MA1 based on the second operation result ORD2.

Figure 11:
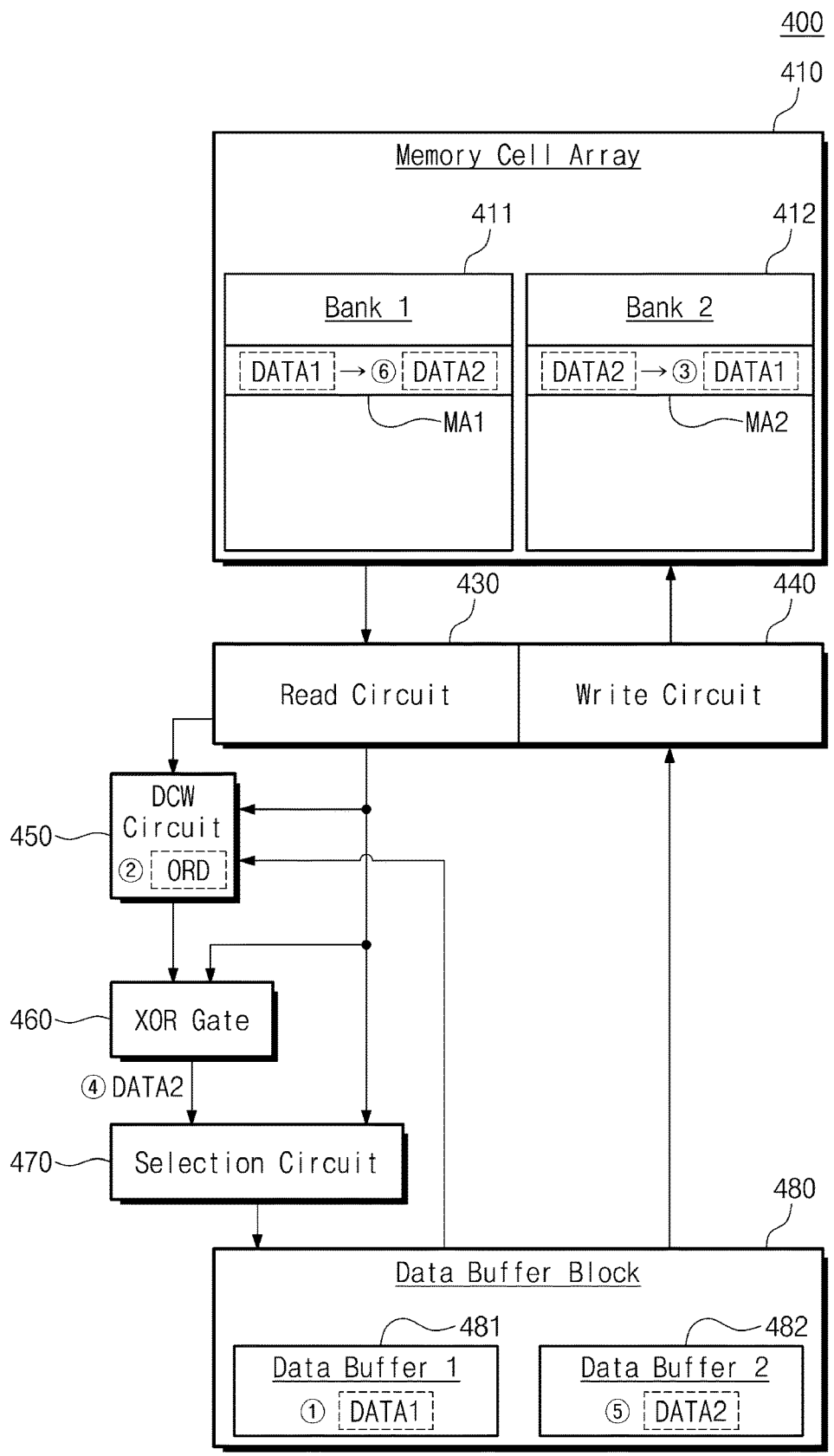
FIG. 11 illustrates another example of an operation in which a memory device of FIG. 7 swaps data based on a command and an address of FIG. 9.

FIG. 11 illustrates another example of an operation in which a memory device of FIG. 7 swaps data based on a command and an address of FIG. 9. Below, an operation in which a memory device of FIG. 7 swaps data stored in different banks will be described with reference to FIGS. 9 to 11.

Referring to FIGS. 9 and 11, the command CMD and the address ADDR of FIG. 9 may be provided from a memory controller for the purpose of swapping the first data DATA1 and the second data DATA2 stored in the first bank 411 and the second bank 412. The data buffer block 480 may include the first data buffer 481 and the second data buffer 482. The first data buffer 481 may correspond to the first bank 411, and the second data buffer 482 may correspond to the second bank 412.

At the first time t1, the active command ACT and the address A1 may be provided. The address A1 may indicate the first memory region MA1 of the first bank 411. In response to the active command ACT and the address A1, the read circuit 430 may read the first data DATA1 from the first memory region MA1. The first data DATA1 thus read may be stored in the first data buffer 481 (①).

After the active command ACT is provided and the delay time tRCD elapses, that is, at the second time t2, the write command WC1 and the address A2 may be provided. The address A2 may indicate the second memory region MA2 of the second bank 412. In response to the write command WC1 and the address A2, the data comparison write circuit 450 may perform an XOR operation on the first data DATA1 provided from the first data buffer 481 and the second data DATA2 read from the second memory region MA2 and may store an operation result ORD as a result of the XOR operation (②). The write circuit 440 may write the first data DATA1 stored in the first data buffer 481 in the second memory region MA2 (③). As such, the second data DATA2 stored in the second memory region MA2 may be replaced with the first data DATA1. In this case, the first data DATA1 stored in the first data buffer 481 may be transferred to the second data buffer 482, and the first data DATA1 may be provided to the write circuit 440 from the second data buffer 482.

After the write command WC1 is provided and the data recovery time tWR elapses, that is, at the third time t3, the swap active command SACT and the address A3 may be provided. The address A3 may indicate the second memory region MA2 of the second bank 412. In response to the swap active command SACT and the address A3, the read circuit 430 may read the first data DATA1 stored in the second memory region MA2 and may provide the first data DATA1 to the XOR gate 460. The XOR gate 460 may perform an XOR operation on the operation result ORD and the first data DATA1 to generate the second data DATA2 (④). The selection circuit 470 may select the second data DATA2 output from the XOR gate 460 and may output the second data DATA2 to the data buffer block 480. The second data DATA2 may be stored in the second data buffer 482 corresponding to the second bank 412 (⑤).

After the swap active command SACT is provided and the delay time tRCD elapses, that is, at the fourth time t4, the write command WC2 and the address A4 may be provided. The address A4 may indicate the first memory region MA1 of the first bank 411. In response to the write command WC2 and the address A4, the write circuit 440 may write the second data DATA2 stored in the second data buffer 482 in the first memory region MA1 (⑥). As such, the first data DATA1 stored in the first memory region MA1 may be replaced with the second data DATA2. In this case, the second data DATA2 stored in the second data buffer 482 may be transferred to the first data buffer 481, and the second data DATA2 may be provided to the write circuit 440 from the first data buffer 481.

An example is illustrated in FIG. 9 that the address ADDR is provided separately from the command CMD when the active command ACT and/or the write command WC are provided, but the disclosure is not limited thereto. For example, the active command ACT and/or the write command WC may include information about a row address and the address ADDR corresponding to the active command ACT and/or the write command WC may include information about a bank address and a column address.

As described above, the memory device 400 may perform the operations of FIG. 8 in response to the active command ACT, the write command WC, and the swap active command SACT. However, the disclosure is not limited thereto. For example, the memory device 400 may perform the operations of FIG. 8 in response to one swap command SWAP.

Below, another example of an operation in which the memory device 400 of FIG. 7 swaps data will be described in detail with reference to FIGS. 12 and 13. In detail, an operation in which data stored in different banks are swapped will be described with reference to FIGS. 12 and 13.

Figure 12:
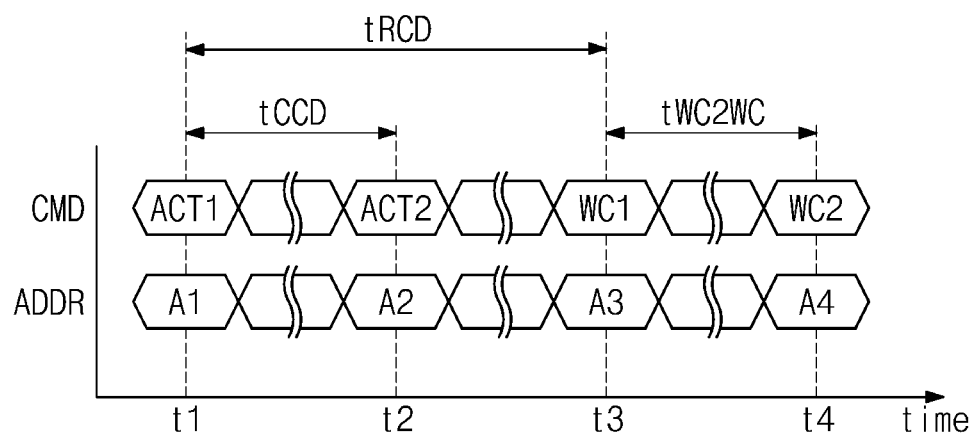
FIG. 12 illustrates an example of a command and an address provided to a memory device of FIG. 7 for a swap of data stored in different banks.

FIG. 12 illustrates an example of a command and an address provided to a memory device of FIG. 7 for a swap of data stored in different banks. FIG. 13 illustrates an example of an operation in which a memory device of FIG. 7 swaps data based on a command and an address of FIG. 12.

Figure 13:
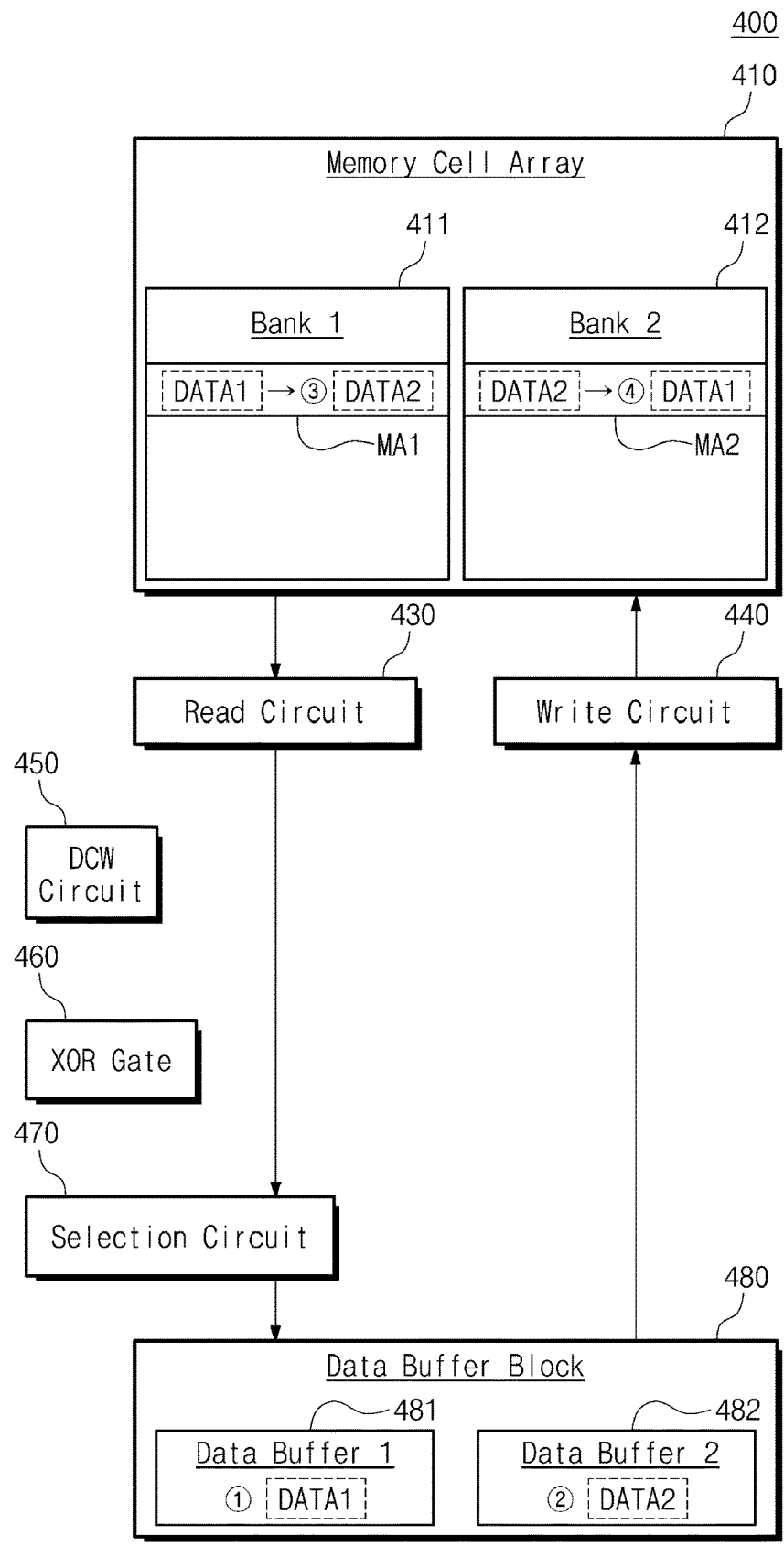
FIG. 13 illustrates an example of an operation in which a memory device of FIG. 7 swaps data based on a command and an address of FIG. 12.

Referring to FIGS. 12 and 13, the command CMD and the address ADDR of FIG. 12 may be provided from a memory controller for the purpose of swapping the first data DATA1 stored in the first bank 411 with the second data DATA2 stored in the second bank 412.

At the first time t1, an active command ACT1 and the address A1 may be provided. The address A1 may indicate the first memory region MA1 of the first bank 411. In response to the active command ACT1 and the address A1, the read circuit 430 may read the first data DATA1 from the first memory region MA1. The first data DATA1 thus read may be stored in the first data buffer 481 through the selection circuit 470 (①).

After the active command ACT1 is provided and a delay time tCCD elapses, that is, at the second time t2, an active command ACT2 and the address A2 may be provided. The address A2 may indicate the second memory region MA2 of the second bank 412. In response to the active command ACT2 and the address A2, the read circuit 430 may read the second data DATA2 from the second memory region MA2. The second data DATA2 thus read may be stored in the second data buffer 482 through the selection circuit 470 (②).

After the active command ACT1 is provided and the delay time tRCD elapses, that is, at the third time t3, the write command WC1 and the address A3 may be provided. The address A3 may indicate the first memory region MA1 of the first bank 411. In response to the write command WC1 and the address A3, the write circuit 440 may write the second data DATA2 stored in the second data buffer 482 in the first memory region MA1 (③). As such, the first data DATA1 stored in the first memory region MA1 may be replaced with the second data DATA2. In this case, the second data DATA2 stored in the second data buffer 482 may be transferred to the first data buffer 481, and the second data DATA2 may be provided to the write circuit 440 from the first data buffer 481. In an exemplary embodiment, as described with reference to FIG. 7, the second data DATA2 may be written based on a comparison result of the data comparison write circuit 450 obtained with regard to the first data DATA1 and the second data DATA2.

After the write command WC1 is provided and a delay time tWC2WC elapses, that is, at the fourth time t4, the write command WC2 and the address A4 may be provided. The address A4 may indicate the second memory region MA2 of the second bank 412. In response to the write command WC2 and the address A4, the write circuit 440 may write the first data DATA1 stored in the first data buffer 481 in the second memory region MA2 (④). As such, the second data DATA2 stored in the second memory region MA2 may be replaced with the first data DATA1. In this case, the first data DATA1 stored in the first data buffer 481 may be transferred to the second data buffer 482, and the first data DATA1 may be provided to the write circuit 440 from the second data buffer 482. In an exemplary embodiment, as described with reference to FIG. 7, the first data DATA1 may be written based on a comparison result of the data comparison write circuit 450 obtained with regard to the first data DATA1 and the second data DATA2.

As described above, in the case of swapping data stored in different banks, as described with reference to FIGS. 9 and 11, the memory device 400 may swap data by using the active command ACT and the swap active command SACT. In this case, the memory device 400 may control the selection circuit 470 such that data are swapped based on data generated through the data comparison write circuit 450 and the XOR gate 460. Alternatively, in the case of swapping data stored in different banks, as described with reference to FIGS. 12 and 13, the memory device 400 may swap data by using the active command ACT, without the swap active command SACT. In this case, the memory device 400 may control the selection circuit 470 such that data are swapped without using data generated through the data comparison write circuit 450 and the XOR gate 460. According to the data swap operation described with reference to FIGS. 12 and 13, in the case of swapping data stored in different banks, data may be swapped more quickly than in the case of the data swap operation described with reference to FIGS. 9 and 11.

As described above, the memory device 400 according to an exemplary embodiment of the disclosure may generate data, which are the same as data (e.g., the second data DATA2) to be swapped, by using the data comparison write (DCW) circuit 450 and the XOR gate 460. In this case, the data to be swapped may be understood as being temporarily stored (or buffered or latched) by the data comparison write circuit 450 and the XOR gate 460 before the data to be swapped are stored in the data buffer block 480.

As such, the memory device 400 may generate or temporarily store data (e.g., the second data DATA2) to be swapped by using separate data generation logic such as the data comparison write circuit 450 and the XOR gate 460. As illustrated in FIGS. 7 to 13, the memory device 400 may include the data comparison write circuit 450 and the XOR gate 460 as the data generation logic, but the disclosure is not limited thereto. For example, the memory device 400 may be implemented with any logic (or block or circuit) capable of generating data to be swapped or temporarily storing data to be swapped.

Figure 14:
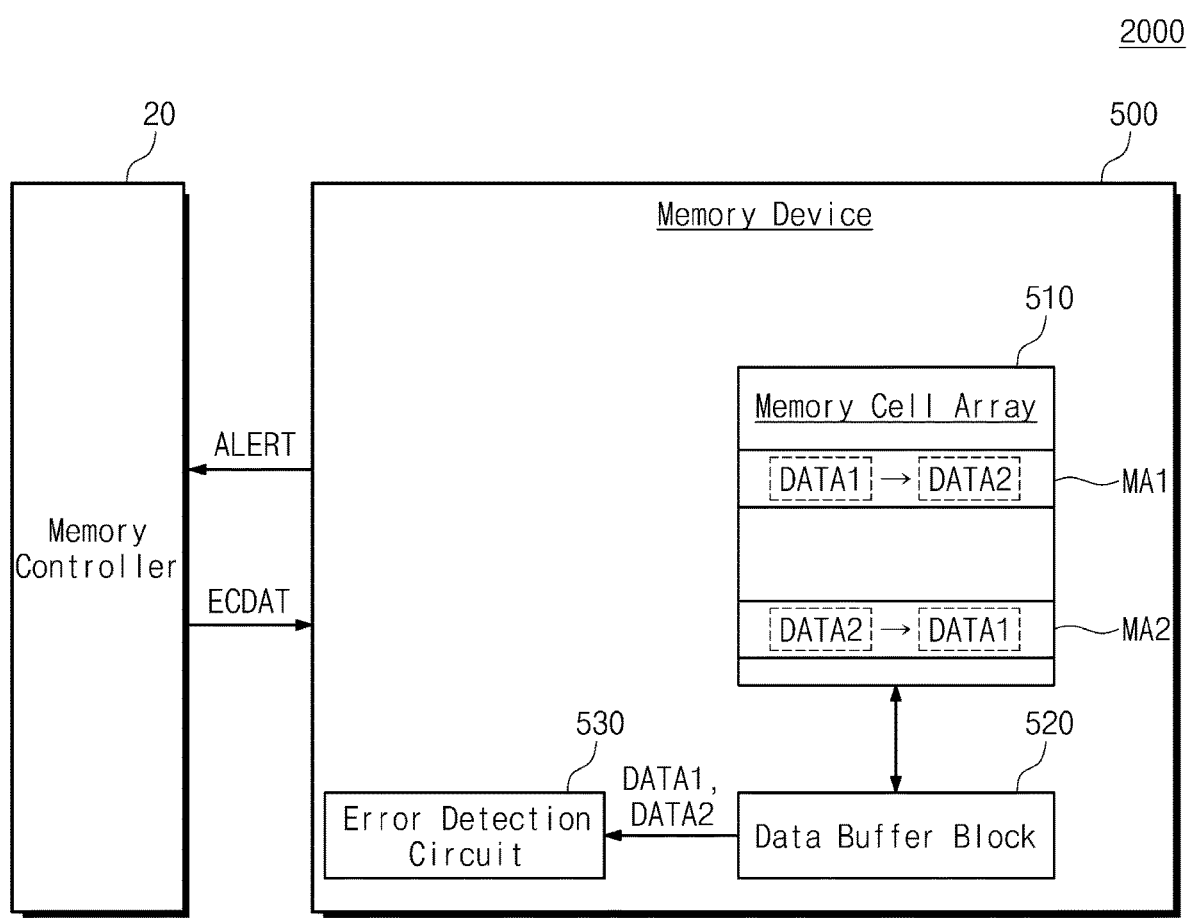
FIG. 14 illustrates a block diagram of a memory system according to an exemplary embodiment of the disclosure.

FIG. 14 illustrates a block diagram of a memory system according to an exemplary embodiment of the disclosure. Referring to FIG. 14, a memory system 2000 may include a memory controller 20 and a memory device 500. The memory device 500 may include a memory cell array 510, a data buffer block 520, and an error detection circuit 530. An operation of the memory device 500 is similar to the operation of the memory device 400 of FIG. 7, and thus, additional description will be omitted to avoid redundancy. That is, the memory device 500 may further include com-ponents such as a data comparison write circuit, but the components are omitted in FIG. 14 for convenience of description.

The memory device 500 may swap the first data DATA1 stored in the first memory region MA1 with the second data DATA2 stored in the second memory region MA2. The memory device 500 may swap data by using the data buffer block 520 as described with reference to FIGS. 7 to 13. In the swap process, the data buffer block 520 may store the first data DATA1 and the second data DATA2.

Before written in the memory cell array 510, the first data DATA1 and the second data DATA2 stored in the data buffer block 520 may be provided to the error detection circuit 530. The error detection circuit 530 may detect an error of the first data DATA1 and the second data DATA2. For example, the error detection circuit 530 may check parity to detect an error.

When an error is detected, the memory device 500 may provide an error detection signal ALERT to the memory controller 20. In response to the error detection signal ALERT, the memory controller 20 may provide error-cor-rected data ECDAT to the memory device 500. For example, when an error is detected from the first data DATA1, the memory controller 20 may provide error-corrected first data to the memory device 500.

The error-corrected data ECDAT may be stored in the data buffer block 520. In this case, data of the data buffer block 520 may be replaced with the error-corrected data ECDAT. As such, the error-corrected data ECDAT of the data buffer block 520 may be written in the memory cell array 510. For example, when an error is detected from the first data DATA1 stored in the first memory region MA1, first data that are error-corrected in a swap process may be written in the second memory region MA2.

An example is illustrated in FIG. 14 that, in the data swap process, the memory device 500 detects an error of data and receives the error-corrected data ECDAT from the memory controller 20, but the disclosure is not limited thereto. For example, the memory device 500 may detect and directly correct an error of data in the data swap process. In this case, the memory device 500 may not provide the error detection signal ALERT to the memory controller 20. That is, the memory device 500 may directly correct an error of data and may perform the swap operation based on error-corrected data.

Figure 15:
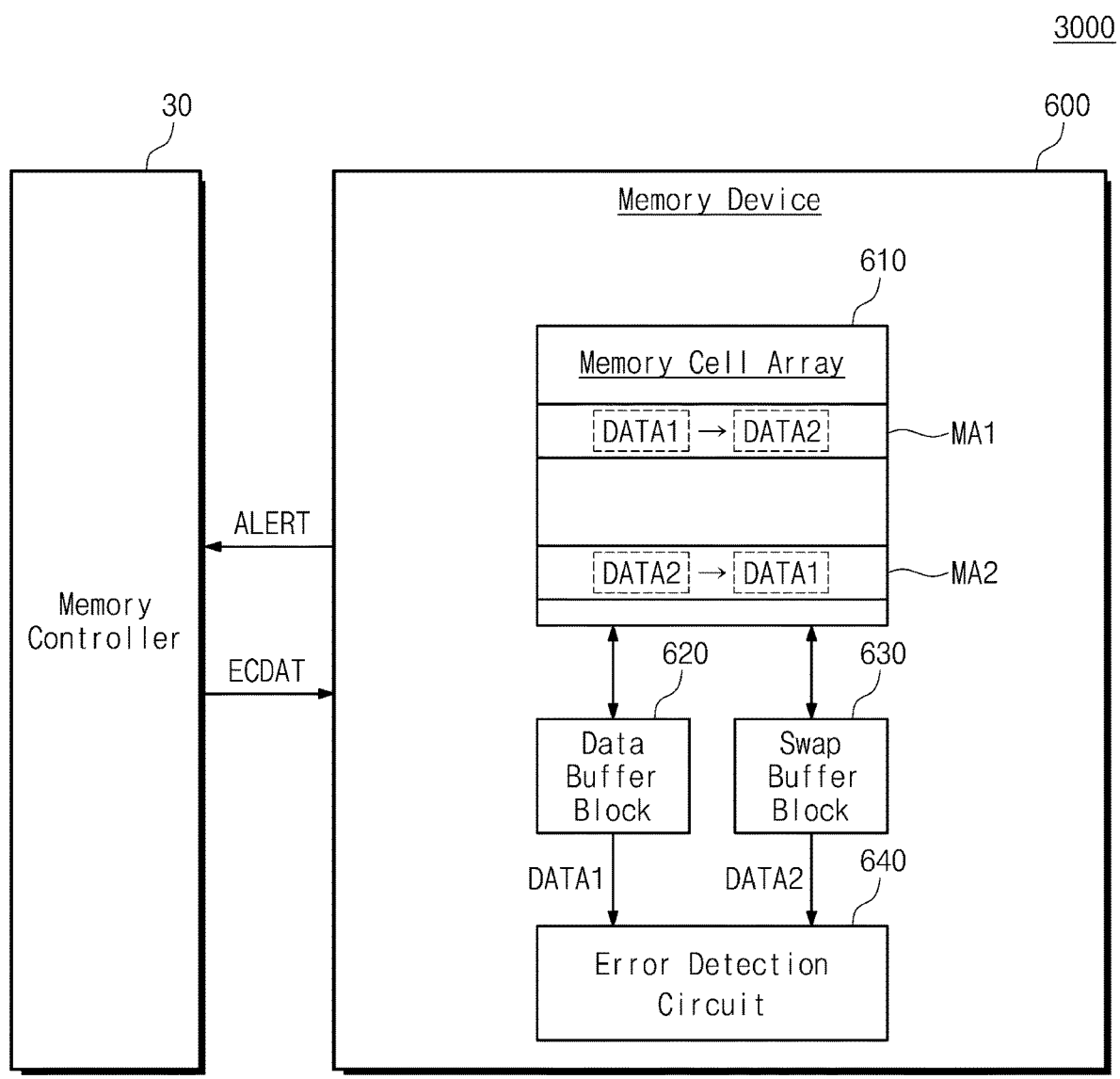
FIG. 15 illustrates a block diagram of a memory system according to an exemplary embodiment of the disclosure.

FIG. 15 illustrates a block diagram of a memory system according to an exemplary embodiment of the disclosure. Referring to FIG. 15, a memory system 3000 may include a memory controller 30 and a memory device 600. The memory device 600 may include a memory cell array 610, a data buffer block 620, a swap buffer block 630, and an error detection circuit 640. An operation of the memory device 600 is similar to the operation of the memory device 200 of FIG. 2, and thus, additional description will be omitted to avoid redundancy. That is, the memory device 600 may further include components such as a data com-parison write circuit, but the components are omitted in FIG. 15 for convenience of description.

The memory device 600 may swap the first data DATA1 stored in the first memory region MA1 with the second data DATA2 stored in the second memory region MA2. The memory device 600 may swap data by using the data buffer block 620 and the swap buffer block 630 as described with reference to FIGS. 2 to 5. In the swap process, the data buffer block 620 may store the first data DATA1, and the swap buffer block 630 may store the second data DATA2.

Before written in the memory cell array 610, the first data DATA1 stored in the data buffer block 620 and the second data DATA2 stored in the swap buffer block 630 may be provided to the error detection circuit 640. The error detection circuit 640 may detect an error of the first data DATA1 and the second data DATA2. For example, the error detection circuit 640 may check parity to detect an error.

When an error is detected, the memory device 600 may provide the error detection signal ALERT to the memory controller 30. In response to the error detection signal ALERT, the memory controller 30 may provide the error-corrected data ECDAT to the memory device 600. For example, when an error is detected from the first data DATA1, the memory controller 30 may provide error-corrected first data to the memory device 600.

The error-corrected data ECDAT may be stored in the data buffer block 620 or the swap buffer block 630. For example, error-corrected first data may be stored in the data buffer block 620 and error-corrected second data may be stored in the swap buffer block 630. In this case, data of the data buffer block 620 or the swap buffer block 630 may be replaced with the error-corrected data ECDAT. As such, the error-corrected data ECDAT may be written in the memory cell array 610.

An example is illustrated in FIG. 15 that, in the data swap process, the memory device 600 detects an error of data and receives the error-corrected data ECDAT from the memory controller 30, but the disclosure is not limited thereto. For example, the memory device 600 may detect and directly correct an error of data in the data swap process. In this case, the memory device 600 may not provide the error detection signal ALERT to the memory controller 30. That is, the memory device 600 may directly correct an error of data and may perform the swap operation based on error-corrected data.

As described above, according to an exemplary embodiment of the disclosure, an error of data may be corrected in the data swap process. Accordingly, the reliability of data that are stored in the data swap process may be improved.

Figure 16:
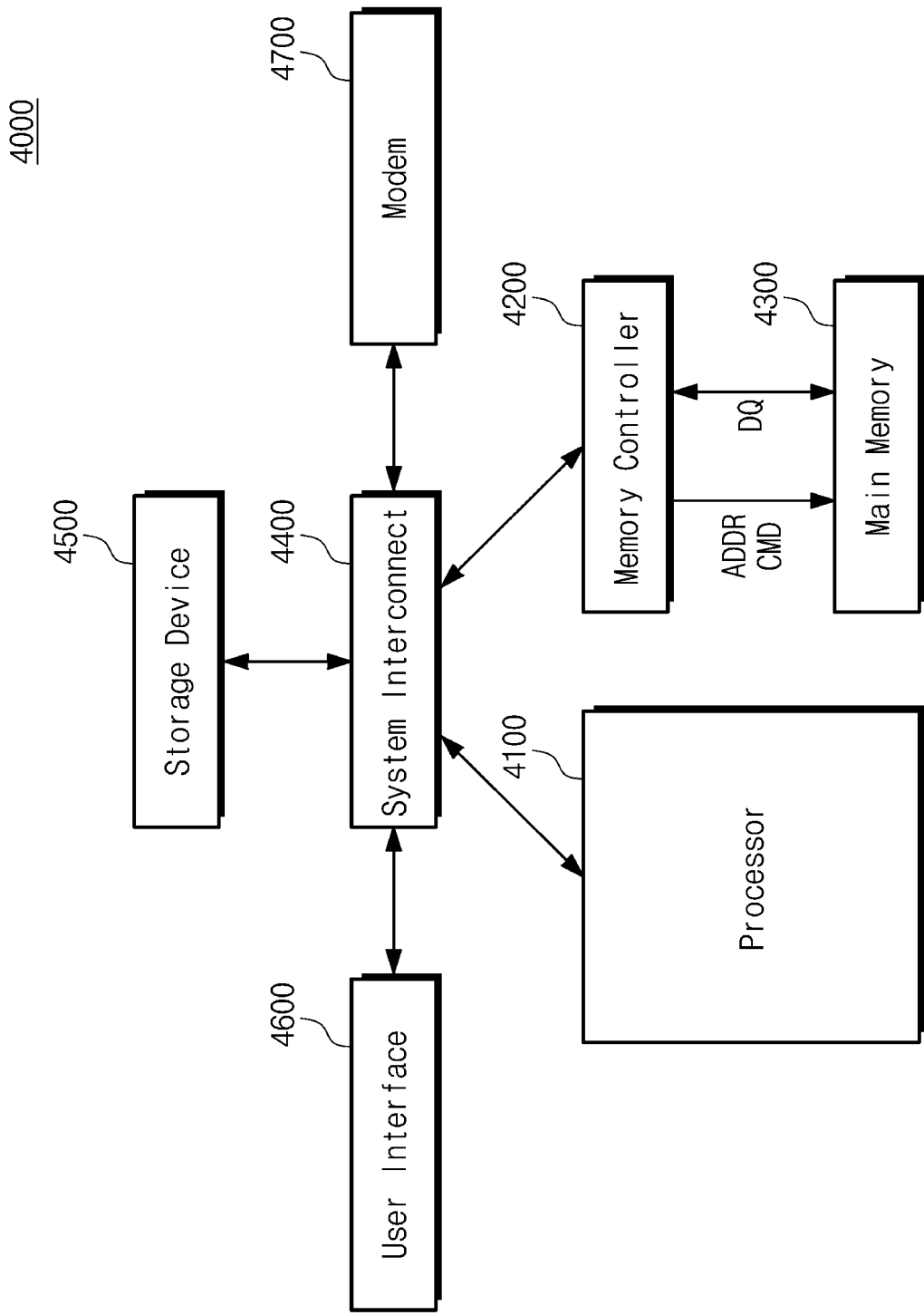
FIG. 16 is a block diagram of a computing device according to an exemplary embodiment of the disclosure.

FIG. 16 is a block diagram of a computing device according to an exemplary embodiment of the disclosure. Referring to FIG. 16, a computing device 4000 may include a processor 4100, a memory controller 4200, a main memory 4300, a system interconnect 4400, a storage device 4500, a user interface 4600, and a modem 4700. The computing device 4000 may be implemented with one of various computing devices such as a desktop computer, a notebook computer, a data server, an application server, a smartphone, and a smart tablet.

The processor 4100 may be a central processing unit (CPU) or an application processor (AP) that performs various operations. The processor 4100 controls the respective components of the computing device 4000 so as to perform a write operation, a read operation, or any other operation. For example, the processor 4100 may access the main memory 4300 by using the memory controller 4200.

The memory controller 4200 may allow the main memory 4300 to perform a write operation or a read operation under control of the processor 4100. For example, the memory controller 4200 may allow the main memory 4300 to perform a write operation on data signals DQ.

In an embodiment, the memory controller 4200 may include the functions of the memory controllers 10 to 30 described with reference to FIGS. 1 to 15. For example, the memory controller 4200 may provide the command CMD for swap and the address ADDR data to the main memory 4300.

The main memory 4300 may receive the address ADDR and the command CMD from the memory controller 4200. The main memory 4300 may exchange the data signals DQ with the memory controller 4200. The main memory 4300 may include a volatile memory, such as a static RAM (SRAM), a dynamic RAM (DRAM), or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

In an embodiment, the main memory 4300 may include one of the memory devices 100 to 600 described with reference to FIGS. 1 to 15. For example, the main memory 4300 may swap data in response to the command CMD for swap and the address ADDR. The main memory 4300 may swap data internally without using the memory controller 4200. Accordingly, a data swap speed may be improved, and the communication overhead between the memory device 4200 and the memory controller 4300 due to the data swap may decrease.

The system interconnect 4400 may provide channels between the components of the computing device 4000. The system interconnect 4400 may be implemented in compliance with one of various standards such as peripheral component interconnect express (PCIe) and advanced microcontroller bus architecture (AMBA).

The storage device 4500 may function as a secondary memory of the computing device 4000. The storage device 4500 may have an access speed slower than the main memory 4300 and may have a storage capacity larger than the main memory 4300. The storage device 4500 may include a hard disk drive (HDD), a solid-state drive (SSD), a portable memory, etc.

The user interface 4600 may exchange information with a user. The user interface 2400 may include a user input interface, which receives information from the user, such as a keyboard, a mouse, a touch panel, or a microphone, and a user output interface, which provides information to the user, such as a monitor, a speaker, or a motor.

The modem 4700 is configured to perform wired or wireless communication with an external device. The modem 4700 may be configured to implement at least one of various standards such as long-term evolution (LTE), Ethernet, wireless-fidelity (Wi-Fi), and Bluetooth. In an exemplary embodiment, the modem 4700 may be included within the processor 4100.

A memory device according to the disclosure may swap data stored in one bank or different banks without using a memory controller. Accordingly, a data swap may be quickly performed, and the communication overhead between the memory device and the memory controller may decrease.

Also, the memory device according to an exemplary embodiment of the disclosure may swap data by using an internal data comparison write circuit without using the memory controller. As such, a data swap operation may be performed within the memory device without adding a separate buffer for swap.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. An operating method of a memory device, which includes a first memory region and a second memory region, the method comprising:
    reading first data from the first memory region and storing the read first data in a data buffer;
    performing a first XOR operation on the first data provided from the data buffer and second data read from the second memory region to generate first result data;
    writing the first data stored in the data buffer in the second memory region;
    performing a second XOR operation on the first data, which is acquired from the first memory region, the data buffer or the second memory region, and the first result data to obtain generated second data;
    storing the generated second data in the data buffer; and
    writing the second data, stored in the data buffer, into the first memory region.

2. The method of claim 1, wherein the first memory region and the second memory region are included in one bank.

3. The method of claim 2, wherein:
    the read first data and the generated second data are stored in a first data buffer of the data buffer, and
    the first data buffer corresponds to the bank.

4. The method of claim 1, wherein the first memory region is included in a first bank and the second memory region is included in a second bank.

5. The method of claim 4, wherein:
    the read first data are stored in a first data buffer of the data buffer and the generated second data are stored in a second data buffer of the data buffer, and
    the first data buffer corresponds to the first bank and the second data buffer corresponds to the second bank.

6. The method of claim 5, wherein the writing of the first data stored in the data buffer in the second memory region includes:
    transferring the first data stored in the first data buffer to the second data buffer; and
    writing the first data transferred to the second data buffer in the second memory region.

7. The method of claim 1, wherein the writing of the first data, stored in the data buffer, into the second memory region includes:
    maintaining the second data of the second memory region when the first result data indicates that the first data of the data buffer are identical to the second data of the second memory region; and
    replacing the second data of the second memory region with the first data when the first result data indicates that the first data of the data buffer are different from the second data of the second memory region.

8. The method of claim 1, wherein error-corrected first data are written in the second memory region when an error is detected from the first data stored in the data buffer.

9. The method of claim 1, wherein the memory device is a phase-change memory (PRAM).

10. A memory device comprising:
    a memory cell array including a first memory region storing first data and a second memory region storing second data;
    a read circuit configured to read the first data from the first memory region;
    a data generation circuit configured to generate third data identical to the second data based on the second data from the second memory region;
    a selection circuit configured to output one of the first data from the read circuit and the third data from the data generation circuit based on a control signal;
    a data buffer configured to store the first data or the third data that is output from the selection circuit; and
    a write circuit configured to write the first data of the data buffer in the second memory region and to write the third data of the data buffer in the first memory region.

11. The memory device of claim 10, wherein:
    the control signal includes a first control signal and a second control signal which are generated in a process of swapping the first data and the second data, and
    the selection circuit outputs the first data based on the first control signal and outputs the third data based on the second control signal.

12. The memory device of claim 10, wherein the data generation circuit includes:
    a data comparison write circuit configured to perform a first XOR operation on the first data and the second data to output result data; and
    an XOR gate configured to perform a second XOR operation on the result data of the data comparison write circuit and the first data to generate the third data.

13. The memory device of claim 10, wherein:
    the first memory region and the second memory region are included in one bank, and
    a first data buffer of the data buffer corresponding to the bank stores the first data and the third data.

14. The memory device of claim 10, wherein:
    the first memory region is included in a first bank, and the second memory region is included in a second bank, and
    a first data buffer of the data buffer corresponding to the first bank stores the first data, and a second data buffer of the data buffer corresponding to the second bank stores the third data.

15. An operating method of a memory device, which includes a first memory region and a second memory region, the method comprising:
    reading first data from the first memory region and storing the read first data in a data buffer;

reading second data from the second memory region and storing the read second data in a swap buffer;

writing the first data stored in the data buffer in the second memory region; and writing the second data stored in the swap buffer in the first memory region.

16. The method of claim 15, wherein:

the first memory region and the second memory region are included in one bank, and the data buffer and the swap buffer correspond to the bank.

17. The method of claim 15, wherein:

the first memory region is included in a first bank, and the second memory region is included in a second bank, and the data buffer corresponds to the first bank, and the swap buffer corresponds to the second bank.

18. The method of claim 15, wherein:

error-corrected first data are written in the second memory region when an error is detected from the first data stored in the data buffer, and error-corrected second data are written in the first memory region when an error is detected from the second data stored in the swap buffer.

19. The method of claim 15, wherein:

the memory device further includes:

a memory cell array including the first memory region and the second memory region; and a data comparison write circuit configured to compare the first data read from the memory cell array and the second data provided from the data buffer to generate a comparison result, and the swap buffer is included in the data comparison write circuit.

20. The method of claim 19, wherein the read second data are stored in the swap buffer in a swap operation of the memory device and the comparison result is stored in the swap buffer in a write operation of the memory device.

* * * * *